(12) United States Patent
Han et al.

(10) Patent No.: US 12,382,649 B2
(45) Date of Patent: Aug. 5, 2025

(54) SEMICONDUCTOR DEVICE AND FORMING METHOD THEREOF

(71) Applicants: TAIWAN SEMICONDUCTOR MANUFACTURING COMPANY, LTD., Hsinchu (TW); TSMC CHINA COMPANY LIMITED, Shanghai (CN)

(72) Inventors: Feng Han, Shanghai (CN); Jian Huang, Shanghai (CN); Lin-Chun Gui, Shanghai (CN); Zhong-Hao Chen, Shanghai (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 17/214,443

(22) Filed: Mar. 26, 2021

(65) Prior Publication Data

US 2022/0199803 A1    Jun. 23, 2022

(30) Foreign Application Priority Data

Dec. 23, 2020    (CN) .......................... 202011548021.9

(51) Int. Cl.
*H10D 30/01* (2025.01)
*H01L 21/265* (2006.01)
(Continued)

(52) U.S. Cl.
CPC ..... *H10D 30/022* (2025.01); *H01L 21/26513* (2013.01); *H01L 21/266* (2013.01);
(Continued)

(58) Field of Classification Search
CPC ......... H01L 29/66492; H01L 21/26513; H01L 21/266; H01L 21/28052; H01L 21/28518;
(Continued)

(56) References Cited

U.S. PATENT DOCUMENTS 5,372,957 A * 12/1994 Liang .................. H01L 29/6659
257/E21.345
5,744,371 A * 4/1998 Kadosh ............. H01L 21/28176
257/E29.268

(Continued)

FOREIGN PATENT DOCUMENTS

TW    200503173 A    1/2005
TW    201926685 A    7/2019

*Primary Examiner* — Syed I Gheyas
(74) *Attorney, Agent, or Firm* — Maschoff Brennan

(57) ABSTRACT

A method includes forming a gate structure over a substrate; forming a first gate spacer and a second gate spacer on opposite sidewalls of the gate structure, respectively; implanting a first dopant of a first conductivity type into the substrate form a lightly doped source region adjacent to the first gate spacer, and a lightly doped drain region adjacent to the second gate spacer; forming a patterned mask over a first portion of the lightly doped drain region, while leaving a second portion of the lightly doped drain region exposed; and with the patterned mask in place, implanting a second dopant of the first conductivity type into the substrate, resulting in converting the second portion of the lightly doped drain region into a drain region.

20 Claims, 22 Drawing Sheets

(51) Int. Cl.
    *H01L 21/266* (2006.01)
    *H01L 21/28* (2006.01)
    *H01L 21/285* (2006.01)
    *H10D 30/60* (2025.01)
    *H10D 64/62* (2025.01)
    *H10D 64/66* (2025.01)

(52) U.S. Cl.
    CPC .. *H01L 21/28052* (2013.01); *H01L 21/28518* (2013.01); *H10D 30/601* (2025.01); *H10D 64/62* (2025.01); *H10D 64/663* (2025.01)

(58) Field of Classification Search
    CPC . H01L 29/45; H01L 29/4933; H01L 29/7833; H01L 29/7835; H10D 30/022; H10D 30/601; H10D 30/603; H10D 30/0221; H10D 30/0227; H10D 84/017; H10D 84/013
    See application file for complete search history.

(56) References Cited

U.S. PATENT DOCUMENTS

| | | |
|---|---|---|
| 6,027,964 A | 2/2000 | Gardner et al. |
| 2008/0213965 A1* | 9/2008 | Yoon .................. H01L 29/7835 |
| | | 438/305 |
| 2010/0065916 A1 | 3/2010 | Shin |
| 2015/0348969 A1* | 12/2015 | Edwards ............... H01L 21/266 |
| | | 438/307 |
| 2017/0062554 A1 | 3/2017 | Tan et al. |
| 2018/0248013 A1 | 8/2018 | Chowdhury et al. |
| 2019/0157419 A1 | 5/2019 | Huang et al. |

\* cited by examiner

SEMICONDUCTOR DEVICE AND FORMING METHOD THEREOF

PRIORITY CLAIM AND CROSS-REFERENCE

The present application claims priority to China Application Serial Number 202011548021.9, filed Dec. 23, 2020, which is herein incorporated by reference in its entirety.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
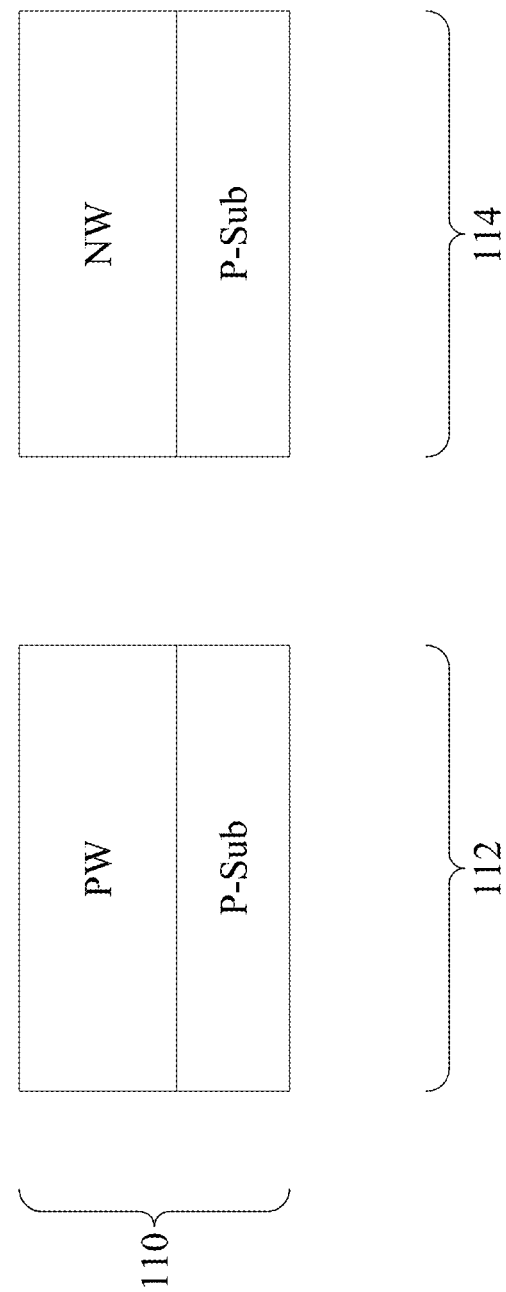
FIGS. 1 through 10 illustrate cross-sectional views of intermediate stages in the formation of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Size of transistors decreases as integrated circuit (IC) scales down. Such size reduction in transistors results in a shortened distance between a gate structure and a drain region in a transistor, which in turn may cause a non-negligible gate-induced drain leakage (GIDL) current. Therefore, the present disclosure in various embodiments provides an additional elongated lightly doped region formed between the gate structure and the drain region, which in turn increases a distance between the gate structure and the drain region, thus reducing the GIDL current.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of planar field-effect transistor (planar FET) is used as an example to explain the concept of the present disclosure. In some other embodiments, Fin Field-Effect Transistor (FinFET) or gate-all-around (GAA) FET may also adopt the embodiments of the present disclosure.

FIGS. 1 through 10 illustrate cross-sectional views of intermediate stages in the formation of transistors in accordance with some embodiments of the present disclosure. The steps shown in FIGS. 1 through 10 are also reflected schematically in the process flow shown in FIG. 11. The formed transistors include a p-type transistor and an n-type transistor in accordance with some exemplary embodiments. Throughout the various views and illustrative embodiments, like reference numbers are used to designate like elements. It is understood that additional operations can be provided before, during, and after the processes shown by FIGS. 1-10, and some of the operations described below can be replaced or eliminated, for additional embodiments of the method. The order of the operations/processes may be interchangeable.

FIG. 1 illustrates a cross-sectional view of an initial structure. The initial structure includes a semiconductor substrate 110. The semiconductor substrate 110 may include a semiconductor wafer such as a silicon wafer. Alternatively, the semiconductor substrate 110 may include other elementary semiconductors such as germanium. The semiconductor substrate 110 may also include a compound semiconductor such as silicon carbide, gallium arsenic, indium arsenide, and indium phosphide. Moreover, the semiconductor substrate 110 may include an alloy semiconductor such as silicon germanium, silicon germanium carbide, gallium arsenic phosphide, and gallium indium phosphide. In some embodiments, the semiconductor substrate 110 includes an epitaxial layer (epi layer) overlying a bulk semiconductor. Furthermore, the semiconductor substrate 110 may include a semiconductor-on-insulator (SOI) structure. For example, the semiconductor substrate 110 may include a buried oxide (BOX) layer formed by a process such as separation by implanted oxygen (SIMOX). In various embodiments, the semiconductor substrate 110 may include a buried layer such as an n-type buried layer (NBL), a p-type buried layer (PBL), and/or a buried dielectric layer including a buried oxide (BOX) layer. In the some embodiments, the semiconductor substrate 110 includes a p-type silicon substrate (p-substrate) or a n-type silicon substrate (n-substrate). In some embodiments, the epitaxial layer (epi layer) overlying the semiconductor substrate 110 is p-type doped or n-type doped.

The semiconductor substrate 110 includes a first device region 112 and a second device region 114. The first device region 112 is an n-type transistor region, in which one or more n-type transistors such as one or more n-type planar FETs, one or more n-type FinFETs, and/or one or more n-type GAA FETs are to be formed. The second device region 114 is a p-type transistor region, in which one or more p-type transistors such as one or more p-type planar FETs, one or more p-type FinFETs, and/or one or more p-type GAA FETs are to be formed. As a result, the device region 112 can be referred to as an NFET region, and the device region 114 can be referred to as a PFET region.

In some embodiments, a p-type well PW is formed within the NFET region 112 in the semiconductor substrate 110, and an n-type well NW is formed within the PFET region 114 in the semiconductor substrate 110. In some embodiments, the p-type well PW is formed by ion implantation. For example, boron ions and/or boron difloride ($BF_2$) ions are implanted in the NFET region 112 to form the p-type well PW. In some other embodiments, the p-type well PW is formed by selective diffusion. In some embodiments, the n-type well NW is also formed by ion implantation. For example, arsenic or phosphorus ions are implanted in the PFET region 114 to form the n-type well NW. In some embodiments, the n-type well NW is formed by selective diffusion.

In embodiments with different well types, different implantation steps for the NFET region 112 and the PFET region 114 may be achieved using different patterned photoresists, as explained in greater detail below. For example, a first photoresist may be formed over the NFET region 112 and the PFET region 114. The first photoresist is then patterned to expose the PFET region 114. The first photoresist can be formed by using a spin-on technique and can be patterned using acceptable photolithography techniques. Once the first photoresist is patterned, an n-type impurity implant is performed in the PFET region 114 to form the n-type well NW, and the first photoresist may act as a mask to substantially prevent n-type impurities from being implanted into the NFET region 112. The n-type impurities may be phosphorus, arsenic, antimony, or the like implanted in the region to a concentration in a range from about $10^{16}$ atoms/cm$^3$ to about $10^{18}$ atoms/cm$^3$. After the implant, the first photoresist is removed, such as by an acceptable ashing process.

Following the implanting of the PFET region 114 and the removal of the first photoresist, a second photoresist is formed over the NFET region 112 and the PFET region 114. The second photoresist is then patterned to expose the NFET region 112. The second photoresist can be formed by using a spin-on technique and can be patterned using acceptable photolithography techniques. Once the second photoresist is patterned, a p-type impurity implant may be performed in the NFET region 112 to form the p-type well PW, and the second photoresist may act as a mask to substantially prevent p-type impurities from being implanted into the PFET region 114. The p-type impurities may be boron, boron fluoride, indium, or the like implanted in the region to a concentration in a range from about $10^{16}$ atoms/cm$^3$ to about $10^{18}$ atoms/cm$^3$. After the implant, the second photoresist may be removed, such as by an acceptable ashing process. The formation order of the n-type well NW and the p-type well PW may be interchangeable.

After the implants of the NFET region 112 and the PFET region 114, an anneal may be performed to repair implant damage and to activate the p-type and/or n-type impurities that were implanted.

Figure 2:
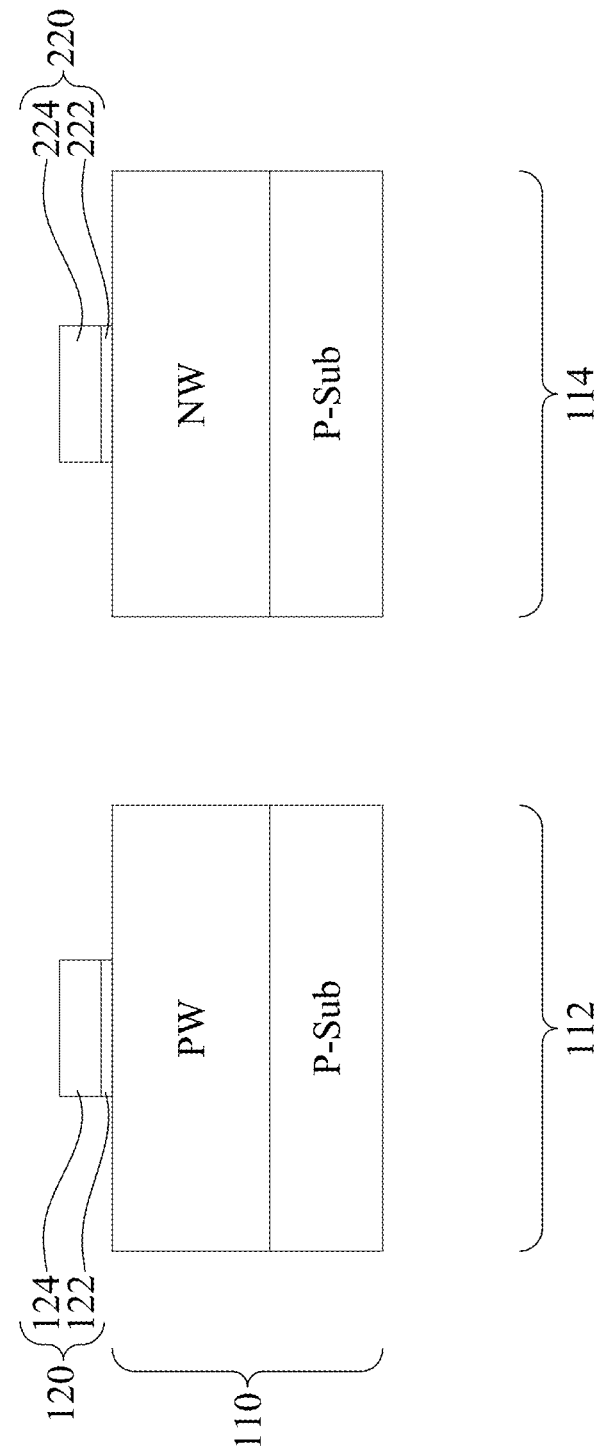

In FIG. 2, gate structures 120 and 220 are respectively formed over the p-type well PW and the n-type well NW. The gate structure 120 includes a gate dielectric layer 122 and a gate electrode 124 over the gate dielectric layer 122. Similarly, the gate structure 220 includes a gate dielectric layer 222 and a gate electrode 224 over the gate dielectric layer 222. In some embodiments, formation of the gate structures 120 and 220 includes, by way of example and not limitation, depositing one or more gate dielectric materials globally over the p-type well PW and the n-type well NW, depositing one or more gate electrode materials over the one or more gate dielectric materials, and then patterning the deposited gate electrode material(s) and gate dielectric material(s) into one or more gate structures 120 localized to the p-type well PW and one or more gate structures 220 localized to the n-well region NW.

In some embodiments, the gate dielectric layers 122 and 222 have the same gate dielectric material because they are formed in same deposition process. Similarly, the gate electrodes 124 and 224 have the same gate electrode material because they are formed in same deposition process. In some embodiments, the gate dielectric layers 122 and 222 may include a silicon oxide layer. Alternatively, the gate dielectric layers 122 and 222 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric layers 122 and 222 may have a multilayer structure such as one layer of silicon oxide and another layer of high-k material. The gate dielectric layers 122 and 222 may be formed using chemical vapor deposition (CVD), physical vapor deposition (PVD), atomic layer deposition (ALD), thermal oxide, other suitable processes, or combinations thereof.

The gate electrodes 124 and 224 may include a doped polycrystalline silicon (or polysilicon). Alternatively, the gate electrodes 124 and 224 may include a metal such as Al, Cu, W, Ti, Ta, TiN, TaN, NiSi, CoSi, other suitable conductive materials, or combinations thereof. The gate electrodes 124 and 224 may be formed by CVD, PVD, plating, and other proper processes. The gate electrodes 124 and 224 may have a multilayer structure and may be formed in a multi-step process using a combination of different processes.

Figure 3:
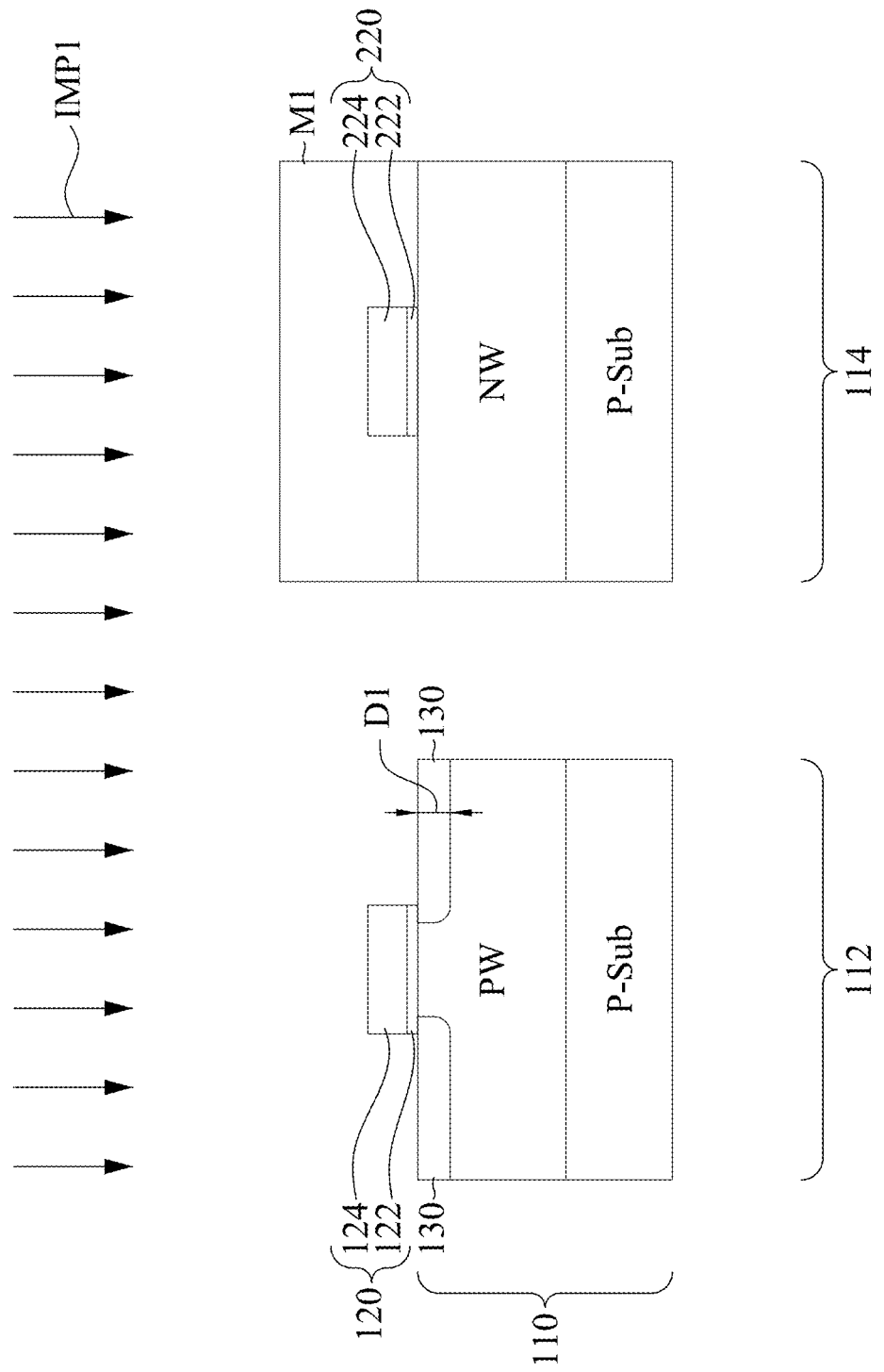

In FIG. 3, a patterned mask layer M1 is formed over the PFET region 114 to define subsequently formed n-type lightly doped regions 130. The patterned mask layer M1 may comprise an organic material, such as a photoresist material, and may be formed using a spin-on coating process, followed by patterning the photoresist material, using suitable lithography techniques, to forming one or more holes extending through the patterned mask layer M1 to expose the NFET region 112. For example, photoresist material is irradiated (exposed) and developed to remove portions of the photoresist material. In greater detail, a photomask (not shown) may be placed over the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used.

Once the patterned mask layer M1 is formed, an n-type light ion implantation IMP1 is performed to dope an n-type impurity (e.g., phosphorus, arsenic, antimony, or the like) into the NFET region 112 to form lightly doped source/drain (LDD) regions 130. The n-type light ion implantation is performed using the gate structure 120 as an implantation mask, such that the n-type LDD regions can be substantially self-aligned to sidewalls of the gate structure 120 without forming a patterned photoresist in the NFET region 112. In some embodiments, the n-type light ion implantation IMP1 implants the n-type dopant at a tilt angle, which in turn results in the n-type LDD regions 130 extending from beyond the gate structure 120 to directly below the gate structure 120. Thus, the n-type LDD regions 130 partially overlap with the gate structure 120.

The n-type LDD regions 130 have a lower dopant concentration than subsequently formed n-type drain region. Therefore, a portion of the n-type LDD regions 130 extending between the gate structure 120 and the subsequently formed n-type drain region can serve to alleviate or suppress the GIDL. In some embodiments, the dopant concentration of the n-type LDD regions 130 (i.e., n-type impurity concentration) is in a range from about $5\times10^{16}$ atoms/cm$^3$ to about $5\times10^{18}$ atoms/cm$^3$, and other dopant concentration ranges are within the scope of the present disclosure. Excessively low dopant concentration in the n-type LDD regions 130 may lead to unsatisfactorily low current density in some embodiments. Excessively high dopant concentration in the n-type LDD regions 130 may lead to insufficient suppression on GIDL in some embodiments. In some embodiments, the dopant concentration of the n-type LDD regions 130 is higher than the dopant concentration of the p-type well PW and the dopant concentration of the n-type well NW. In some embodiments, the n-type LDD regions 130 has a depth in a range from about 50 nm to about 500 nm, and other ranges are within the scope of the present disclosure.

After the n-type light ion implantation IMP1 is completed, the patterned mask layer M1 is removed, for example, using a plasma ash process. In some embodiments, a plasma ash process is performed such that the temperature of the photoresist mask M1 is increased until the photoresist mask M1 experiences a thermal decomposition and may be removed. However, any other suitable process, such as a wet strip, may be utilized.

Figure 4:
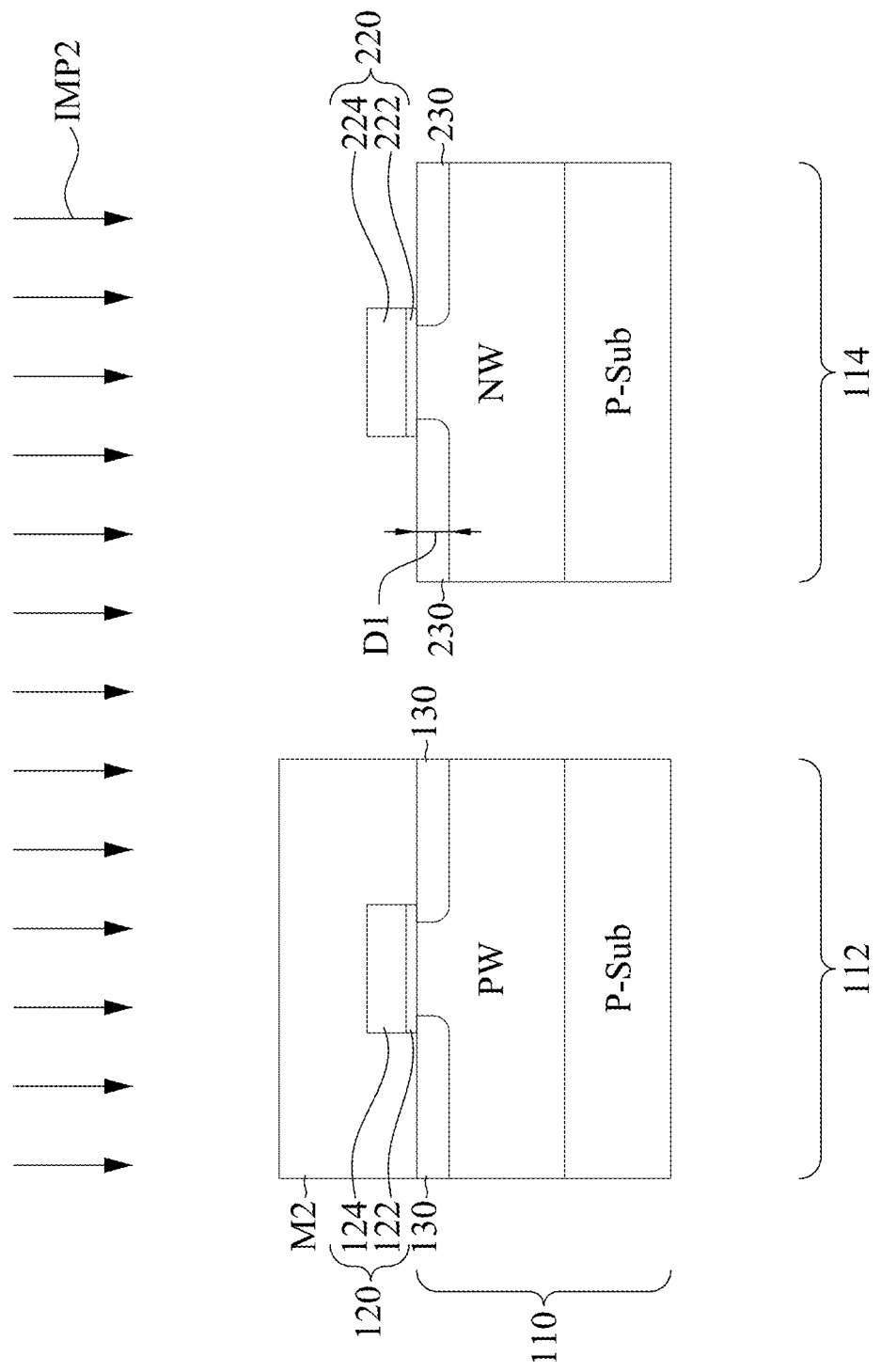

In FIG. 4, a patterned mask layer M2 is formed over the NFET region 112 to define subsequently formed p-type lightly doped regions 230. The patterned mask layer M2 may comprise an organic material, such as a photoresist material, and may be formed using a spin-on coating process, followed by patterning the photoresist material, using suitable lithography techniques, to forming one or more holes extending through the patterned mask layer M2 to expose the PFET region 114. Details about the photolithography process are described previously with respect to the patterned mask layer M1, and thus are not repeated for the sake of brevity.

Once the patterned mask layer M2 is formed, a p-type light ion implantation IMP2 is performed to dope a p-type impurity (e.g., boron, boron fluoride, indium, or the like) into the PFET region 112 to form p-type LDD regions 230. The p-type light ion implantation is performed using the gate structure 220 as an implantation mask, such that the p-type LDD regions can be substantially self-aligned to sidewalls of the gate structure 220 without forming a patterned photoresist in the PFET region 114. In some embodiments, the p-type light ion implantation IMP2 implants the p-type dopant at a tilt angle, which in turn results in the p-type LDD regions 230 extending from beyond the gate structure 220 to below the gate structure 220. Thus, the p-type LDD regions 230 partially overlap with the gate structure 220.

The p-type LDD regions 230 have a lower dopant concentration than subsequently formed p-type drain region. Therefore, a portion of the p-type LDD regions 230 can serve to alleviate or suppress the GIDL between the gate structure 220 and the subsequently formed p-type drain region. In some embodiments, the dopant concentration of the p-type LDD regions 230 (i.e., p-type impurity concentration) is in a range from about $5\times10^{16}$ atoms/cm$^3$ to about $5\times10^{18}$ atoms/cm$^3$, and other dopant concentration ranges are within the scope of the present disclosure. Excessively low dopant concentration in the p-type LDD regions 230 may lead to unsatisfactorily low current density in some embodiments. Excessively high dopant concentration in the p-type LDD regions 230 may lead to insufficient suppression on GIDL in some embodiments. In some embodiments, the dopant concentration of the p-type LDD regions 230 is higher than the dopant concentration of the p-type well PW and the dopant concentration of the n-type well NW. In some embodiments, the p-type LDD regions 230 has a depth in a range from about 50 nm to about 500 nm, and other ranges are within the scope of the present disclosure. After the p-type light ion implantation IMP2 is completed, the patterned mask layer M2 is removed, for example, using a plasma ash process. However, any other suitable process, such as a wet strip, may be utilized.

In some embodiments as illustrated in FIGS. 3 and 4, the n-type LDD regions 130 are formed first, followed by forming the p-type LDD regions 230. In some other embodiments, the p-type LDD regions 230 are formed first, followed by forming the n-type LDD regions 130. Sated differently, the p-type light ion implantation IMP2 is performed prior to the n-type light ion implantation IMP1. In some embodiments, after the n-type light ion implantation IMP1 and/or the p-type light ion implantation IMP2 are completed, an anneal may be performed to repair implant damage and to activate the p-type and/or n-type impurities that were implanted.

Figure 5:
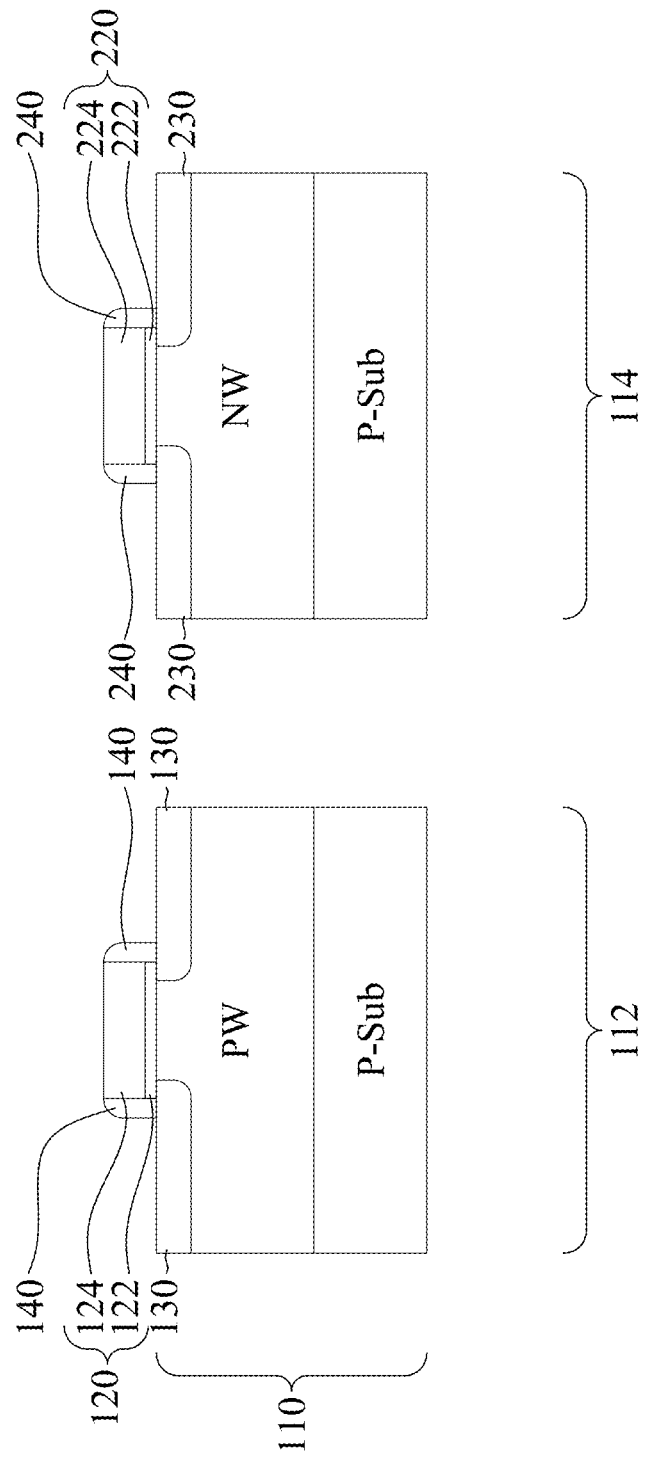

In FIG. 5, after the n-type LDD regions 130 and the p-type LDD regions 230 are formed, gate spacers 140 are formed on opposite sidewalls of the gate structure 120, and gate spacers 240 are formed on opposite sidewalls of the gate structure 220. Spacers 140 and 240 can be formed by, for example, conformally forming one or more layers of spacer materials on the substrate 110 by using suitable deposition techniques (e.g., CVD, ALD, or combinations thereof), followed by etching the one or more layers of spacer materials by using an anisotropic etching process. The anisotropic etching process removes horizontal portions of the one or more layers of spacer materials, while leaving vertical portions of the one or more layers of spacer materials on sidewalls of the gate structures 120 and 220. The remaining spacer materials on sidewalls of the gate structure 120 can be referred to as gate spacers 140, and remaining spacer materials on sidewalls of the gate structure 220 can be referred to as gate spacers 240. In some embodiments, the anisotropic etching is an RIE process using a plasma produced from $CHF_3$ gas and/or $Cl_2$ gas. In some embodiments, The gate spacers 140 and 240 include silicon nitride ($Si_3N_4$), although other materials, such as silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials, may be used.

Figure 6:
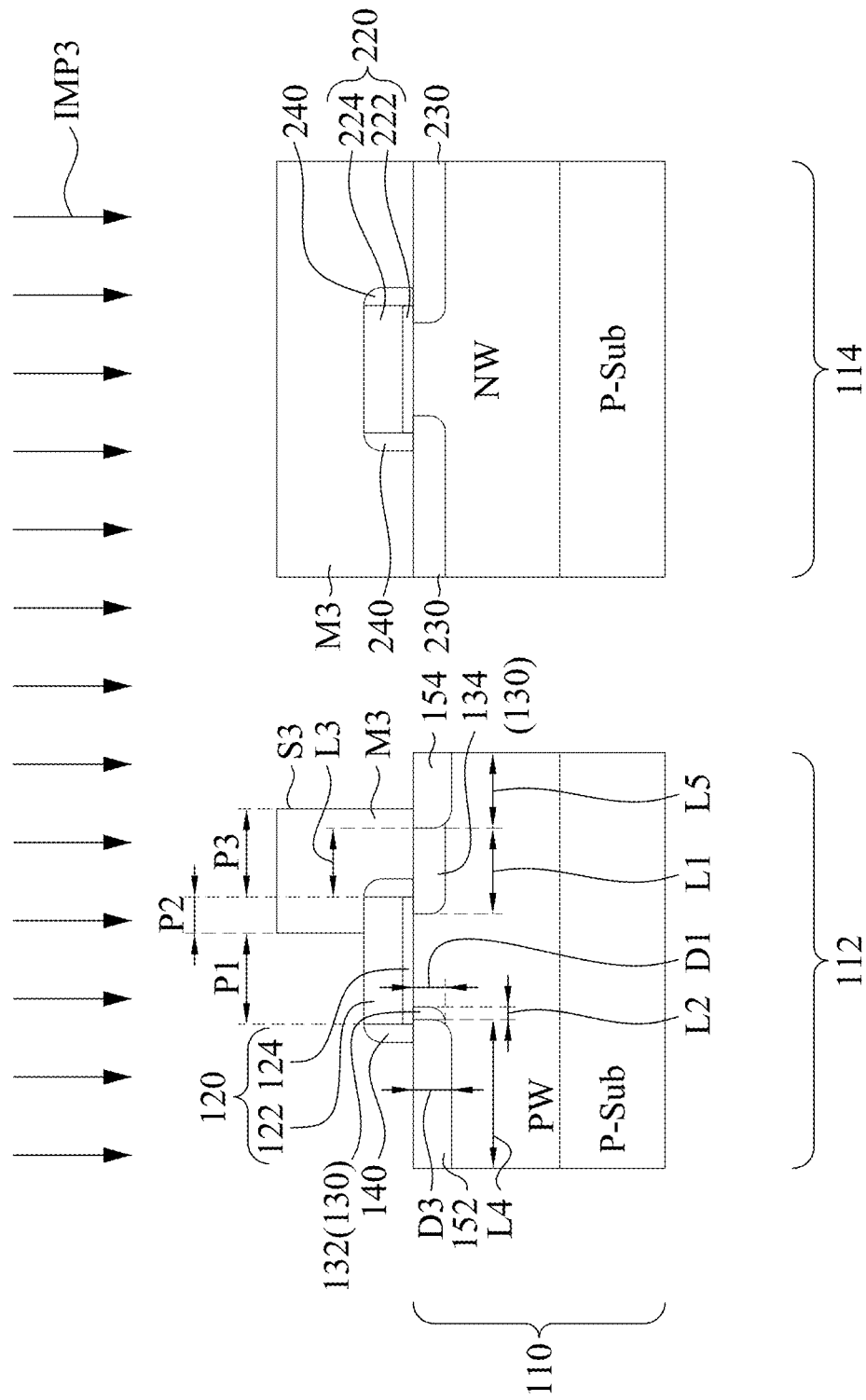

In FIG. 6, a patterned mask layer M3 (e.g. patterned photoresist) is formed on the PFET region 114 and a partial region of an n-type LDD region 130. For example, the patterned mask layer M3 covers a portion of the gate structure 120 (e.g., a right portion of the gate structure 120 as depicted in FIG. 6), a gate spacer 140 next to the portion of the gate structure 120, and an n-type LDD region 130 next to the gate spacer 140. The patterned mask layer M3 exposes other portions of the n-type LDD regions 130. Once the patterned mask layer M3 is formed, an n-type heavy ion implantation IMP3 is performed to dope an n-type impurity (e.g., phosphorus, arsenic, antimony, or the like) into the exposed the n-type LDD regions 130, thus forming an n-type source region 152 and an n-type drain region 154 doped with the n-type impurity. The n-type source/drain regions 152/154 have a higher dopant concentration than the n-type LDD regions 130. Therefore, the n-type source region 152 can act as a source terminal of an NFET, the n-type drain region 154 can act as a drain terminal of the NFET, and a remaining region of the n-type LDD region 130 can serve to alleviate or suppress the GIDL between the gate structure 120 and the n-type drain region 154.

In some embodiments, the dopant concentration of the n-type source/drain regions 152/154 is in a range from about $10^{19}$ atoms/cm$^3$ to about $10^{20}$ atoms/cm$^3$, and other dopant concentration ranges are within the scope of the present disclosure. In some embodiments, the dopant concentration of the n-type source/drain regions 152/154 is greater than the dopant concentration of the n-type LDD regions 130 by at least an order of magnitude. If the dopant concentration of the n-type LDD regions 130 is not less than the dopant concentration of n-type source/drain regions 152/154 by at least an order of magnitude, the remaining portion of n-type LDD region 130 may exhibit insufficient suppression on GIDL.

In some embodiments, the n-type source/drain regions 152/154 have a dopant depth D3 greater than or equal to the dopant depth D1 of the n-type LDD regions 130, so that the n-type source/drain regions 152/154 can be deep enough to generate an expected current value in the channel region below the gate structure 120. For example, a ratio of the dopant depth D3 of the n-type source/drain regions 152/154 to the dopant depth D1 of the n-type LDD regions 130 is in a range from about 1:1 to about 2:1, and other ranges are also within the scope of the present disclosure.

Some remaining portions of the n-type LDD regions 130 have a dopant concentration substantially unchanged by the n-type heavy ion implantation IMP3, because they are masked by the patterned mask layer M3 and/or gate spacers 140. Therefore, the remaining portions of the n-type LDD region 130 keep a lower dopant concentration than the dopant concentration of the n-type source/drain regions 152/154. The remaining unchanged portions of the n-type LDD regions 130 includes a first remaining portion 132 extending from the n-type source region 152 toward the channel region below the gate structure 120, and a second remaining portion 134 extending from the n-type drain region 154 toward the channel region. Therefore, the first remaining portion 132 is interchangeably referred to as an n-type source extension region, and the second remaining portion 134 is interchangeably referred to as an n-type drain extension region. Because the patterned mask layer M3 covers the n-type LDD region 130 on a first side of the gate structure 120 (e.g., right side of gate structure 120 as illustrated in FIG. 6) but uncovers n-type LDD region 130 on a second side of the gate structure 120 (e.g., left side of gate structure 120 as illustrated in FIG. 6), the n-type source extension region 132 and the n-type drain extension region 134 are asymmetric about a vertical axis of the gate structure 120 after performing the n-type heavy ion implantation process IMP3 by using the patterned mask layer M3 as an implantation mask. In greater detail, the n-type drain extension region 134 laterally extends a length L1 from the n-type drain region 154, the n-type source extension region 132 laterally extends a length L2 from the n-type source region 152, and the length L1 of the n-type drain extension region 134 is greater than the length L2 of the n-type source extension region 132. As a result, a lateral distance L3 between the n-type drain region 154 and the gate structure 120 can be increased by the elongated n-type drain extension region 134, thus alleviating or suppressing the GIDL.

Moreover, because the lateral length L2 of the n-type source extension region 132 is shorter than the lateral length L1 of the n-type drain extension region 134, a lateral distance between the n-type source region and the gate structure 120 is shorter than the lateral distance L3 between the n-type drain region 154 and the gate structure 120, thus allowing for NFET size reduction. The asymmetric n-type source/drain regions 152/154 thus allow for suppressing GIDL without excessively increasing NFET size. Therefore, such an asymmetric transistor is applicable for a circuit that has a stricter transistor density requirement (interchangeably referred to as a density-oriented circuit), such as micro organic light-emitting diode (μOLED) pixel driver circuit or other circuits.

In some embodiments, a ratio of the lateral length L1 of the n-type drain extension region 134 to the lateral length L2 of the n-type source extension region 132 is in a range from about 2:1 to about 5:1, and other ranges are within the scope of the present disclosure. Excessively large L1/L2 ratio may lead to unsatisfactorily low current density, because the lateral length L1 of the n-type drain extension region 134 may be excessively long. Excessively small L1/L2 ratio may lead to insufficient suppression on GIDL, because the lateral length L1 of the n-type drain extension region 134 may be excessively short. Alternatively, excessively small L1/L2 ratio may lead to an increased NFET size, because the lateral length L2 of the n-type source extension region 134 may be excessively long. The NFET with an increased size may thus be unsuitable for the density-oriented circuit.

In some embodiments, the gate structure 120 has a region exposed by the patterned mask layer M3 and another region covered by the patterned mask layer M3. Stated differently, the gate structure 120 laterally extends beyond the patterned mask layer M3 by a non-zero length P1, and the gate structure 120 laterally extends within the patterned mask layer M3 by a non-zero length P2. In some embodiments, a sum of the non-zero lengths P1 and P2 is substantially equal to 0.1 times the predetermined Vdd value of the resultant transistor, and other values or ranges are within the scope of the present disclosure. In some embodiments, the patterned mask layer M3 has a sidewall S3 on the n-type drain region 154. The sidewall S3 of the patterned mask layer M3 is spaced apart from the gate structure 120 by a lateral distance P3 in a range from about 0.1 μm to about 0.5 μm, and other ranges are within the scope of the present disclosure. Excessively long lateral distance P3 between the patterned mask sidewall S3 and the gate structure 120 may lead to unsatisfactorily low current density in the resultant NFET. Excessively short lateral distance P3 between the patterned mask sidewall S3 and the gate structure 120 may lead to insufficient suppression on the GIDL.

In some embodiments, the n-type heavy ion implantation IMP3 implants ionized dopants at a tilted angle, such that the n-type source region 152 laterally extends past an outermost sidewall of the gate spacer 140 to directly below the gate spacer 140. Similarly, the implantation tilted angle also allows for n-type drain region 154 laterally extending past the sidewall S3 of the patterned mask layer M3 to directly below the patterned mask layer M3. Therefore, the patterned mask layer M3 can overlap a boundary between the n-type drain region 154 and the n-type drain extension region 134.

After the n-type heavy ion implantation IMP3 is completed, the patterned mask layer M3 is removed, for example, using a plasma ash process. However, any other suitable process, such as a wet strip, may be utilized to remove the patterned mask layer M3 as well.

Figure 7:
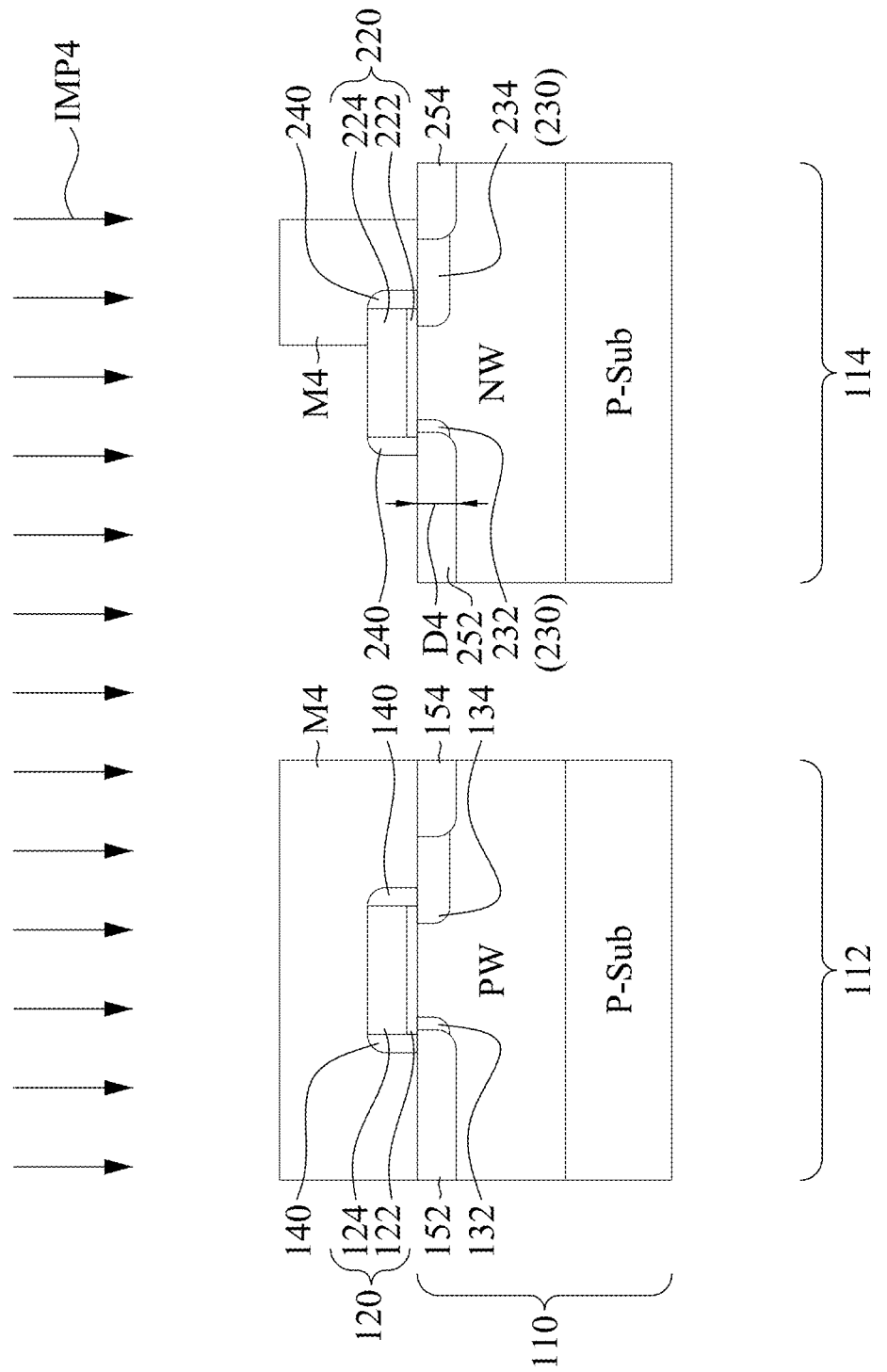

In FIG. 7, a patterned mask layer M4 (e.g. patterned photoresist) is formed on the NFET region 112 and a partial region of a p-type LDD region 230. For example, the patterned mask layer M4 covers a portion of the gate structure 220 (e.g., a right portion of the gate structure 220 as depicted in FIG. 7), a gate spacer 240 next to the portion of the gate structure 220, and a p-type LDD region 230 next to the gate spacer 240. The patterned mask layer M4 exposes other portions of the p-type LDD regions 230. Once the patterned mask layer M4 is formed, a p-type heavy ion implantation IMP4 is performed to dope a p-type impurity (e.g., boron, boron fluoride, indium, or the like) into the exposed the p-type LDD regions 230, thus forming a p-type source region 252 and a p-type drain region 254 doped with the p-type impurity. The p-type source/drain regions 252/254 have a higher dopant concentration than the p-type LDD regions 230. Therefore, the p-type source region 252 can act as a source terminal of a PFET, the p-type drain region 254 can act as a drain terminal of the PFET, and a remaining region of the p-type LDD region 230 can serve to alleviate or suppress the GIDL between the gate structure 220 and the p-type drain region 254.

In some embodiments, the dopant concentration of the p-type source/drain regions 252/254 is in a range from about $10^{19}$ atoms/cm$^3$ to about $10^{20}$ atoms/cm$^3$, and other dopant concentration ranges are within the scope of the present disclosure. In some embodiments, the dopant concentration of the p-type source/drain regions 252/254 is greater than the dopant concentration of the p-type LDD regions 230 by at least an order of magnitude. If the dopant concentration of the p-type LDD regions 230 is not less than the dopant concentration of p-type source/drain regions 252/254 by at least an order of magnitude, the remaining portion of p-type LDD region 230 may exhibit insufficient suppression on GIDL.

In some embodiments, the p-type source/drain regions 252/254 have a dopant depth D4 greater than or equal to the dopant depth D2 of the p-type LDD regions 230, so that the p-type source/drain regions 252/254 can be deep enough to generate an expected current value in the channel region below the gate structure 220. For example, a ratio of the dopant depth D4 of the p-type source/drain regions 252/254 to the dopant depth D2 of the p-type LDD regions 230 is in a range from about 1:1 to about 2:1, and other ranges are also within the scope of the present disclosure.

Some remaining portions of the p-type LDD regions 230 have a dopant concentration substantially unchanged by the p-type heavy ion implantation IMP4, because they are masked by the patterned mask layer M4 and/or gate spacers 240. Therefore, the remaining portions of the p-type LDD region 230 keep a lower dopant concentration than the dopant concentration of the p-type source/drain regions 252/254. The remaining unchanged portions of the p-type LDD regions 230 includes a first remaining portion 232 extending from the p-type source region 252 toward the channel region below the gate structure 220, and a second remaining portion 234 extending from the p-type drain region 254 toward the channel region. Therefore, the first remaining portion 232 is interchangeably referred to as a p-type source extension region, and the second remaining portion 234 is interchangeably referred to as a p-type drain extension region. Because the patterned mask layer M4 covers the p-type LDD region 230 on a first side of the gate structure 220 (e.g., right side of gate structure 220 as illustrated in FIG. 7) but uncovers the p-type LDD region 230 on a second side of the gate structure 220 (e.g., left side of gate structure 220 as illustrated in FIG. 7), the p-type source extension region 232 and the p-type drain extension region 234 are asymmetric about a vertical axis of the gate structure 220 after performing the p-type heavy ion implantation process IMP4 by using the patterned mask layer M4 as an implantation mask. In greater detail, the lateral length of the p-type drain extension region 234 is greater than the lateral length of the p-type source extension region 232. As a result, a lateral distance between the p-type drain region 254 and the gate structure 220 can be increased by the elongated p-type drain extension region 234, thus alleviating or suppressing the GIDL. In some embodiments, ratio ranges between the lateral lengths of the p-type source/drain extension regions 232/234 and reasons about why the ratio ranges are selected are similar to that about the length ratio L1/L2 between the NFET source/drain extension regions, and thus they are not repeated herein for the sake of brevity.

Moreover, because the lateral length of the p-type source extension region 232 is shorter than the lateral length of the p-type drain extension region 234, a lateral distance between the p-type source region 252 and the gate structure 220 is shorter than a lateral distance between the p-type drain region 254 and the gate structure 220, thus allowing for PFET size reduction. For example, in the embodiment as depicted in FIG. 7, the lateral distance between the p-type source region 252 and the gate structure 220 is substantially zero. In other words, a boundary between the p-type source region 252 and the p-type source extension region 232 is substantially aligned with a sidewall of the gate structure 220. The asymmetric p-type source/drain regions 252/254 thus allow for suppressing GIDL without excessively increasing PFET size. Therefore, such an asymmetric transistor is applicable for a density-oriented circuit.

In some embodiments, the gate structure 220 laterally extends beyond the patterned mask layer M4 by a non-zero length, and the gate structure 220 also laterally extends within the patterned mask layer M4 by a non-zero length. In some embodiments, a sum of the non-zero extending lengths of the gate structure 220 is substantially equal to 0.1 times the predetermined Vdd value of the resultant transistor, and other values or ranges are within the scope of the present disclosure. In some embodiments, the patterned mask layer M4 has a sidewall on the p-type drain region 254. The sidewall of the patterned mask layer M4 is spaced apart from the gate structure 220 by a lateral distance in a range from about 0.1 µm to about 0.5 µm, and other ranges are within the scope of the present disclosure. Reasons about why the lateral distance range is selected are similar to that about the lateral distance P3 between the patterned mask sidewall S3 and the gate structure 120, and thus they are not repeated herein for the sake of brevity.

In some embodiments, the p-type heavy ion implantation IMP4 implants ionized dopants at a tilted angle, such that the p-type source region 252 laterally extends past an outermost sidewall of the gate spacer 240 to directly below the gate spacer 240. Similarly, the implantation tilted angle also allows for p-type drain region 254 laterally extending past the sidewall of the patterned mask layer M4 to directly below the patterned mask layer M4. Therefore, the patterned mask layer M4 can overlap a boundary between the p-type drain region 254 and the p-type drain extension region 234.

After the p-type heavy ion implantation IMP4 is completed, the patterned mask layer M4 is removed, for example, using a plasma ash process. However, any other suitable process, such as a wet strip, may be utilized to remove the patterned mask layer M4 as well.

In some embodiments as illustrated in FIGS. 6 and 7, the n-type source/drain regions 152/154 are formed first, followed by forming the p-type source/drain regions 252/254. In some other embodiments, the p-type source/drain regions 252/254 are formed first, followed by forming the n-type source/drain regions 152/154. Stated differently, the p-type heavy ion implantation IMP4 is performed prior to the n-type heavy ion implantation IMP3. In some embodiments, after the n-type heavy ion implantation IMP3 and/or the p-type heavy ion implantation IMP4 are completed, an anneal may be performed to repair implant damage and to activate the p-type and/or n-type impurities that were implanted.

Figure 8:
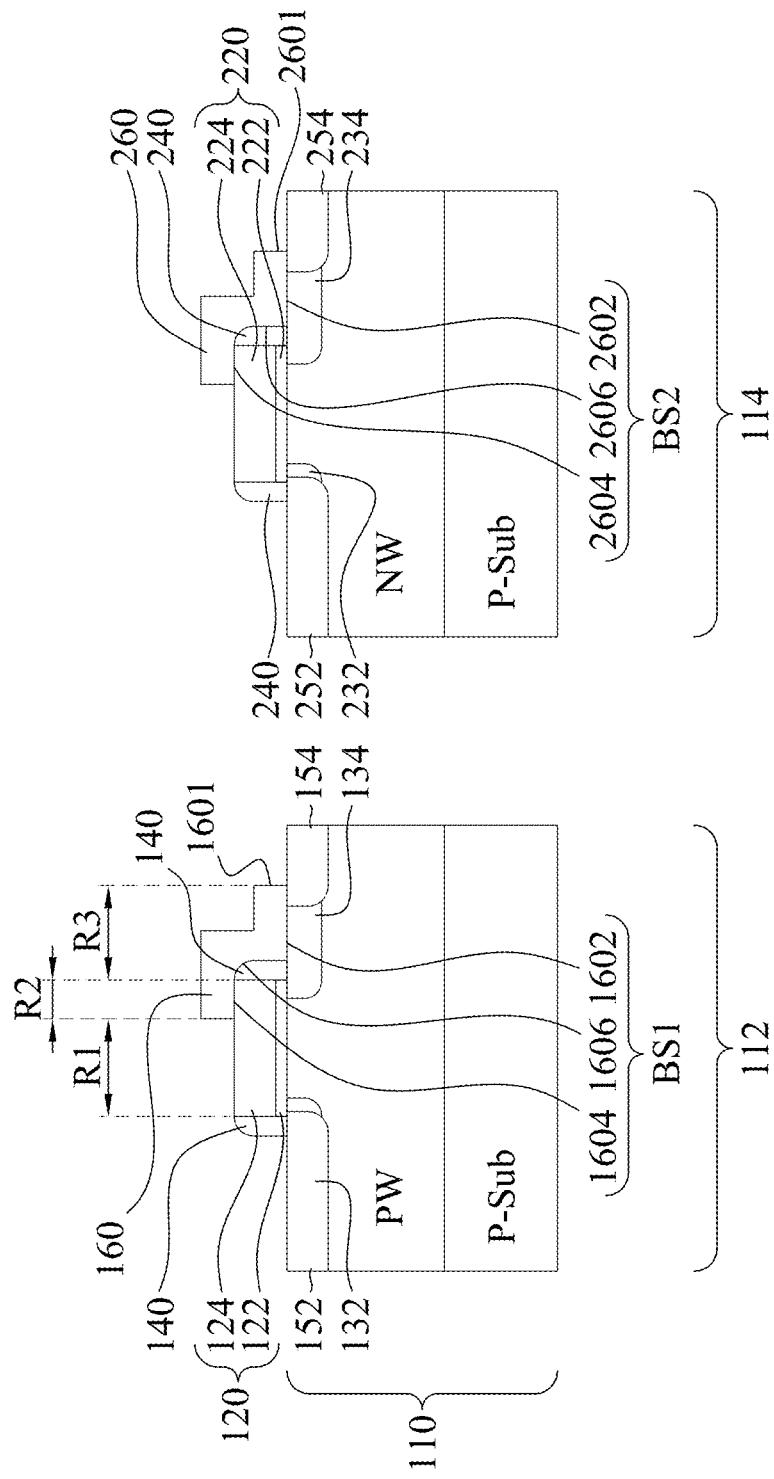

In FIG. 8, resist protection oxide (RPO) layers 160 and 260 are formed respectively within the NFET region 112 and the PFET region 114. The RPO layer 160 covers an n-type drain extension 134 extending beyond the gate structure 140, and the RPO layer 260 covers a p-type drain extension region 234 extending beyond the gate structure 240. The RPO layers 160 and 260 can be formed by, for example, depositing an oxide layer (e.g., SiO$_2$ layer) spanning the NFET region 112 and the PFET region 114, followed by patterning the oxide layer into the RPO layers 160 and 260 by using suitable etching techniques (e.g., dry etching, wet etching or combinations thereof). The RPO layers 160 and 260 may function as a silicide blocking layer during a subsequent self-aligned silicidation (or also called salicide) process discussed below. More particularly, the RPO layers 160 and 260 cover device areas that will not be formed with silicide. In greater detail, the RPO layers 160 and 260 cover partial regions of the n-type drain region 154 and p-type drain region 254, thus serving to define silicide regions that will be subsequently formed on the n-type drain region 154 and p-type drain region 254. Moreover, the RPO layers 160 and 260 also cover partial regions of the gate electrodes 124 and 224, thus serving to define silicide regions that will be subsequently formed on the gate electrodes 124 and 224.

The gate electrode 124 has a portion exposed by the RPO layer 160 and another portion covered by the RPO layer 160. Stated differently, the gate electrode 124 laterally extends beyond the RPO layer 160 by a non-zero length R1, and also laterally extends within the RPO layer 160 by a non-zero length R2. In some embodiments, the RPO layer 160 has an end surface 1601 on the n-type drain region 154. The RPO end surface 1601 is laterally spaced apart from the gate structure 120 by a distance R3, which is greater than or equal to the previously discussed lateral distance P3 between the patterned mask sidewall S3 and the gate structure 120 (as shown in FIG. 6), so as to ensure that no silicide will be formed on the n-type drain extension region 134 in the subsequent silicidation process. If the lateral distance R3 between RPO end surface 1601 and the gate structure 120 is less than the lateral distance P3 between the previous mask sidewall S3 and the gate structure 120, silicide region may be inadvertently formed on the n-type drain extension region 134 in the subsequent silicidation process. For similar reasons, an end surface of the RPO layer 260 on the p-type drain region 254 is also laterally spaced apart from the gate structure 220 by a lateral distance, which is greater than or equal the lateral distance between the mask sidewall of previous mask layer M4 and the gate structure 220 (as shown in FIG. 7).

In some embodiments, the RPO layer 160 has a stepped bottom surface structure BS1. The stepped bottom surface structure BS1 has a first step 1602, a second step 1604 higher than the first step 1602, and a step rise 1606 connecting the first step 1602 to the second step 1604. The first step 1602 of the stepped bottom surface structure BS1 laterally extends from the n-type drain extension region 134, past a boundary between the n-type drain extension region 134 and the n-type drain region 154, to within the n-type drain region 154. The first step 1602 terminates prior to covering an entirety of the n-type drain region 154. The second step 1604 of stepped bottom surface structure BS1 laterally extends from the gate spacer 140, past an interface between the gate spacer 140 and the gate electrode 124, to within a top surface of the gate electrode 124. The second step 1604 terminates prior to covering an entirety of the gate electrode 124. The step rise 1606 extends along an outermost sidewall of the gate spacer 140. When the outermost sidewall of the gate spacer 140 has a rounded corner at its top resulting from fabrication process(s) (e.g., anisotropic etching used in forming the gate spacers 140 and 240), a top end of the step rise 1606 has a corresponding rounded corner (e.g., concave surface).

Similarly, in some embodiments, the RPO layer 260 has a stepped bottom surface structure BS2. The stepped bottom surface structure BS2 has a first step 2602, a second step 2604 higher than the first step 2602, and a step rise 2606 connecting the first step 2602 to the second step 2604. The first step 2602 of the stepped bottom surface structure BS2 laterally extends from the p-type drain extension region 234, past a boundary between the p-type drain extension region 234 and the p-type drain region 254, to within the p-type drain region 254. The first step 2602 terminates prior to covering an entirety of the p-type drain region 254. The second step 2604 of stepped bottom surface structure BS2 laterally extends from the gate spacer 240, past an interface between the gate spacer 240 and the gate electrode 224, to within a top surface of the gate electrode 224. The second step 2604 terminates prior to covering an entirety of the gate electrode 224. The step rise 2606 extends along an outermost sidewall of the gate spacer 240. When the outermost sidewall of the gate spacer 240 has a rounded corner at its top, a top end of the step rise 2606 has a corresponding rounded corner.

In some embodiments, when material of the RPO layers 160 and 260 is conformally deposited on the substrate 110, the RPO layers 160 and 260 have stepped top surface structures conformal to the stepped bottom surface structures BS1 and BS2, as illustrated in FIG. 8.

Figure 9:
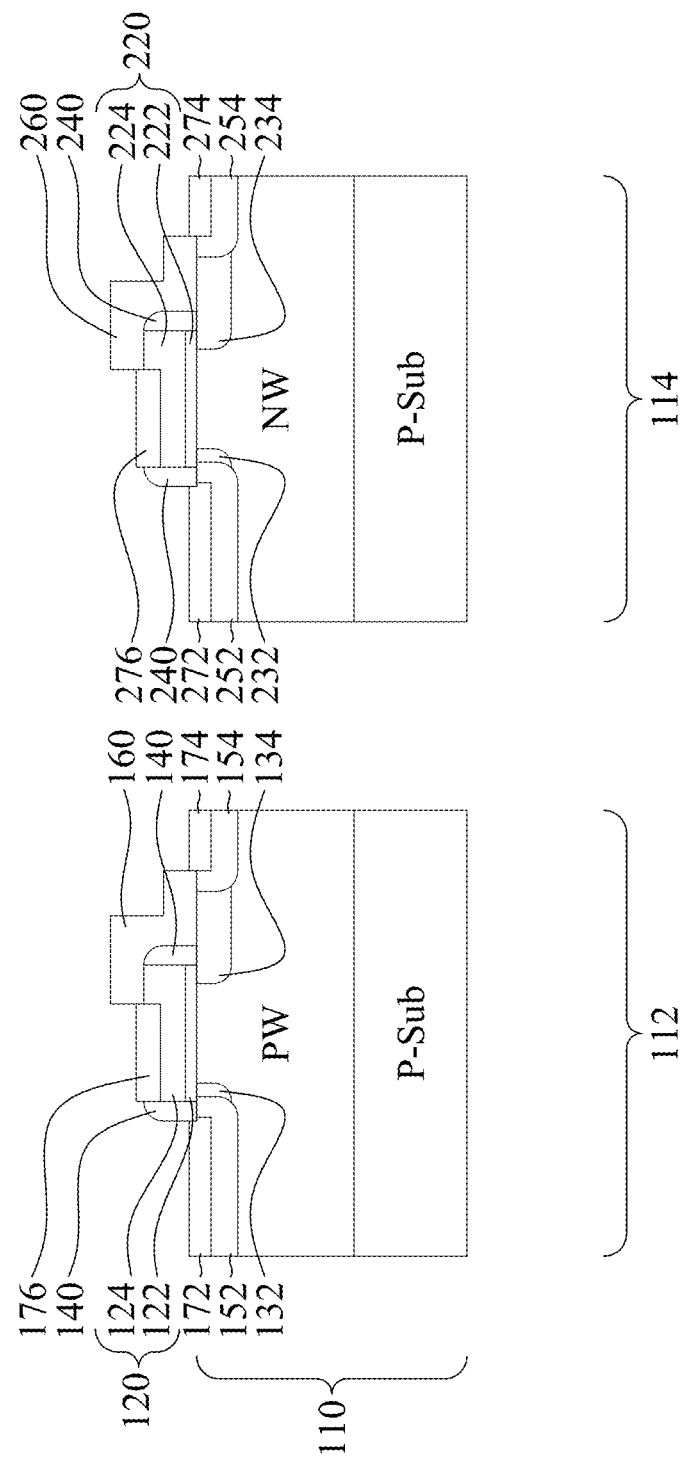

In FIG. 9, silicide regions 172, 174, 176, 272, 274, and 276 can be formed by a silicidation process (e.g., self-aligned silicidation process). In some embodiments, the silicide regions 172, 174, 176, 272, 274, and 276 are formed by first depositing a metal (not shown) capable of reacting with the single-crystalline silicon of the underlying source/drain regions 152, 154, 252, 254 and poly-crystalline silicon of the underlying gate electrodes 124, 224, such as nickel, cobalt, titanium, tantalum, platinum, tungsten, other noble metals, other refractory metals, rare earth metals or their alloys, over the exposed portions of the source/drain regions 152, 154, 252, 254 and gate electrodes 124, 224, then performing a thermal anneal process to form silicide regions 172, 174, 272, 274 respectively on the source/drain regions 152, 154, 252, 254, and to form silicide regions 176 and 276 respectively on the gate electrodes 124 and 224. The unreacted portions of the deposited metal are then removed, e.g., by an etching process. Although the silicide regions 172, 174, 176, 272, 274, and 276 are referred to as silicide regions, silicide regions 172, 174, 176, 272, 274, and 276 may also be germanide regions, or silicon germanide regions (e.g., regions comprising silicide and germanide), if the source/drain regions 152, 154, 252, 254 and/or gate electrodes 124, 224 include germanium or silicon germanium.

In some embodiments, as illustrated in FIG. 9, the silicide region 172 extends from within the n-type source region 152 to above a top surface of the n-type source region 152; the silicide region 174 extends from within the n-type drain region 154 to above a top surface of the n-type drain region 154; the silicide region 176 extends from within the gate electrode 124 to above a top surface of the gate electrode 124; the silicide region 272 extends from within the p-type source region 252 to above a top surface of the p-type source region 252; the silicide region 274 extends from within the p-type drain region 254 to above a top surface of the p-type drain region 254; the silicide region 276 extends from within the gate electrode 224 to above a top surface of the gate electrode 224. Therefore, the gate silicide region 176 and the n-type drain silicide region 174 respectively contact opposite end surfaces of the RPO layer 160, and gate silicide region 276 and the p-type drain region 274 respectively contact opposite end surfaces of the RPO layer 260. Moreover, the n-type source silicide region 172 contacts an outermost sidewall of the gate spacer 140, and the p-type silicide region 272 contacts an outermost sidewall of the gate spacer 240.

Figure 10:
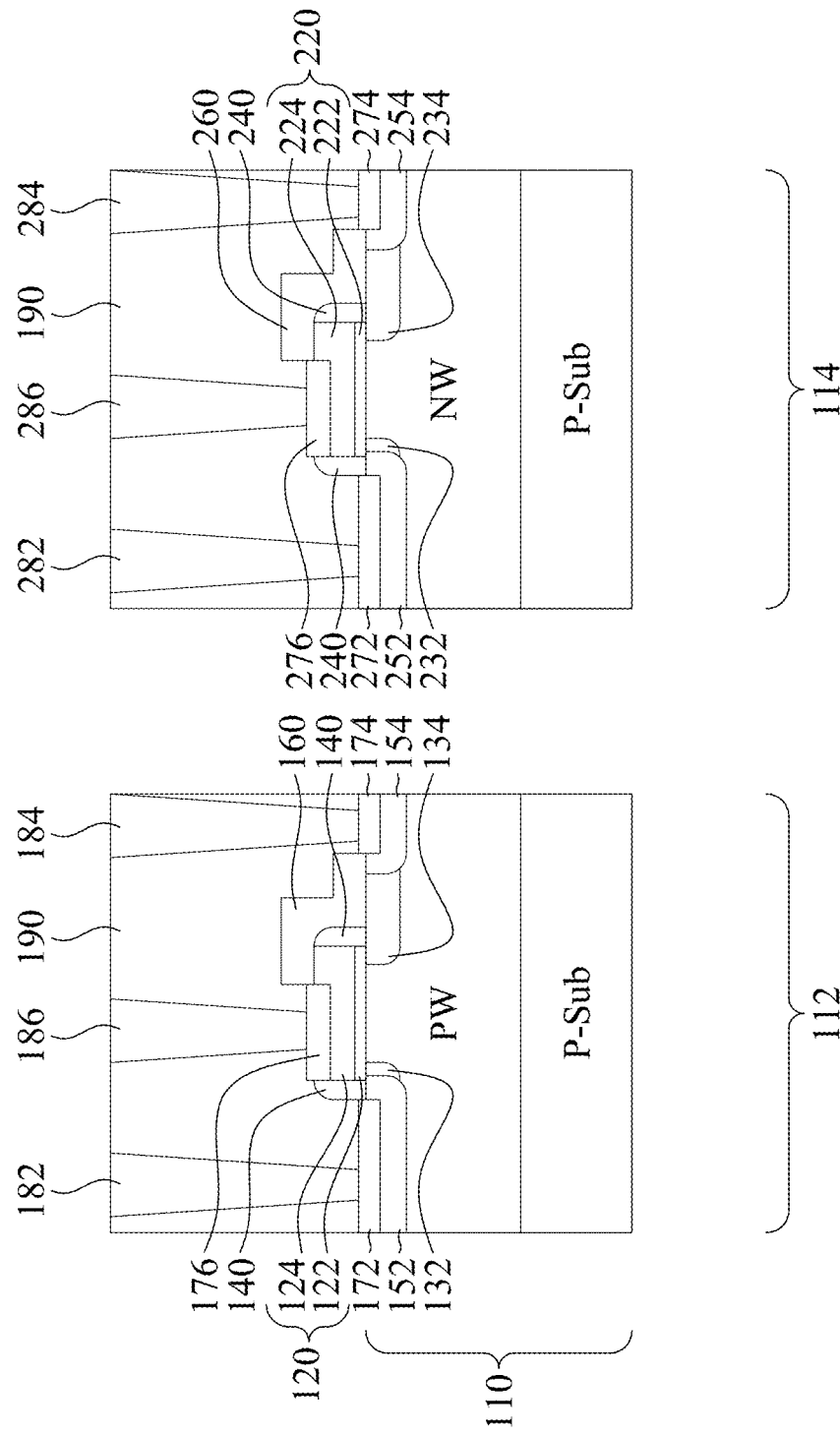

In FIG. 10, an interlayer dielectric (ILD) layer 190 is deposited to span across the NFET region 112 and the PFET region 114. The ILD layer 190 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (not shown) is deposited on the substrate 110 prior to depositing the ILD layer 190. The CESL may comprise a dielectric material, such as, silicon nitride, silicon oxide, silicon oxynitride, or the like, having a different etch rate than the material of the overlying ILD layer 190.

Next, a source contact 182, a drain contact 184, and a gate contact 186 are formed extending through the ILD layer 190 within the NFET region 112, and a source contact 282, a drain contact 284, and a gate contact 286 are formed extending through the ILD layer 190 within the PFET region 114. In the NFET region 112 the source contact 182 extends through the ILD layer 190 to the n-type source silicide region 172, the drain contact 184 extends through the ILD layer 190 to the n-type drain silicide region 174, and the gate contact 186 extends through the ILD layer 190 to the gate silicide region 176. In the PFET region 114 the source contact 282 extends through the ILD layer 190 to the p-type source silicide region 272, the drain contact 284 extends through the ILD layer 190 to the p-type drain silicide region 274, and the gate contact 286 extends through the ILD layer 190 to the gate silicide region 276. These contacts 182, 184, 186, 282, 284, and 286 may each comprise one or more layers, such as barrier layers, diffusion layers, and fill materials. For example, in some embodiments, the contacts 182, 184, 186, 282, 284, and 286 each include a barrier layer and a conductive material, and are electrically coupled to the underlying conductive features (e.g., silicide region). The barrier layer may include titanium, titanium nitride, tantalum, tantalum nitride, or the like. The conductive material may be copper, a copper alloy, silver, gold, tungsten, cobalt, aluminum, nickel, or the like.

The contacts 182, 184, 186, 282, 284, and 286 can be formed, for example, forming contact openings in the ILD layer 190 to expose silicide regions 172, 174, 176, 272, 274, and 276 by using suitable photolithography and etching processes, depositing one or more layers of metal materials in the contact openings. Next, a planarization process, such as a CMP, may be performed to remove excess material from a surface of the ILD layer 190.

Figure 11:
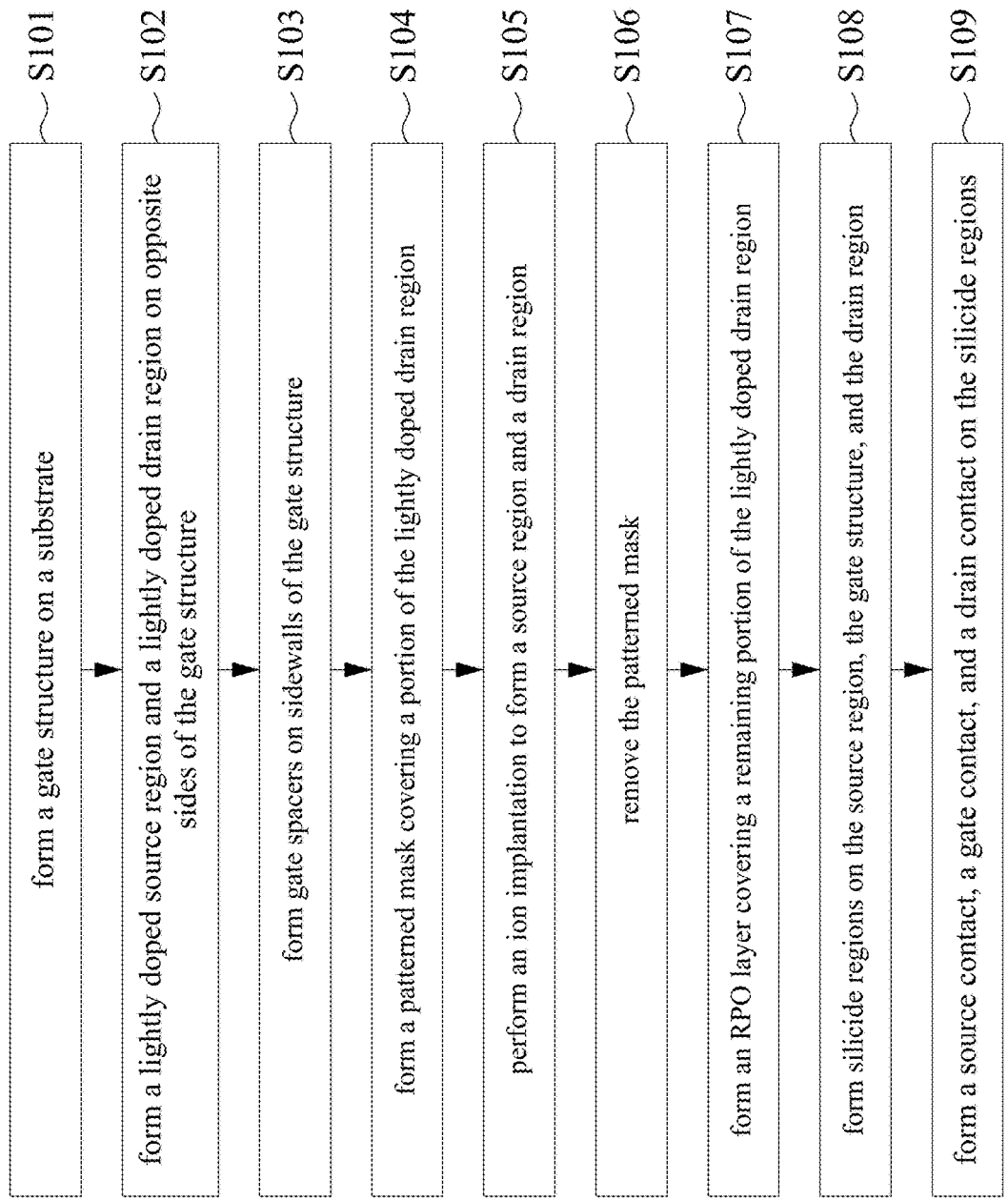
FIG. 11 is a flow chart illustrating a method of forming an integrated circuit in accordance with some embodiments of the present disclosure.

FIG. 11 illustrates a method of forming an integrated circuit in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a gate structure is formed on a substrate. FIG. 2 illustrates a cross-sectional view of some embodiments corresponding to act in block S101.

At block S102, a lightly doped source region and a lightly doped drain region are formed on opposite sides of the gate structure. FIGS. 3 and 4 illustrate cross-sectional views of some embodiments corresponding to act in block S102.

At block S103, gate spacers are formed on sidewalls of the gate structure. FIG. 5 illustrates a cross-sectional view of some embodiments corresponding to act in block S103.

At block S104, a patterned mask is formed covering a portion of the lightly doped drain region. FIGS. 6 and 7 illustrate cross-sectional views of some embodiments corresponding to act in block S104.

At block S105, an ion implantation process is performed to form a source region and a drain region. FIGS. 6 and 7 illustrate cross-sectional views of some embodiments corresponding to act in block S105.

At block S106, the patterned mask is removed. FIG. 8 illustrates a cross-sectional view of some embodiments corresponding to act in block S106.

At block S107, an RPO layer is formed covering a remaining portion of the lightly doped drain region. FIG. 8 illustrates a cross-sectional view of some embodiments corresponding to act in block S107.

At block S108, silicide regions are formed on the source region, the gate structure, and the drain region. FIG. 9 illustrates a cross-sectional view of some embodiments corresponding to act in block S108.

At block S109, a source contact, a gate contact, and a drain contact on the silicide regions. FIG. 10 illustrates a cross-sectional view of some embodiments corresponding to act in block S109.

FIGS. 12-16 show exemplary sequential processes for manufacturing an integrated circuit according to some embodiments of the present disclosure. It is understood that additional operations can be provided before, during, and after processes shown by FIGS. 12-16, and some of the operations described below can be replaced or eliminated, for additional embodiments of the method. The order of the operations/processes may be interchangeable.

Figure 12:
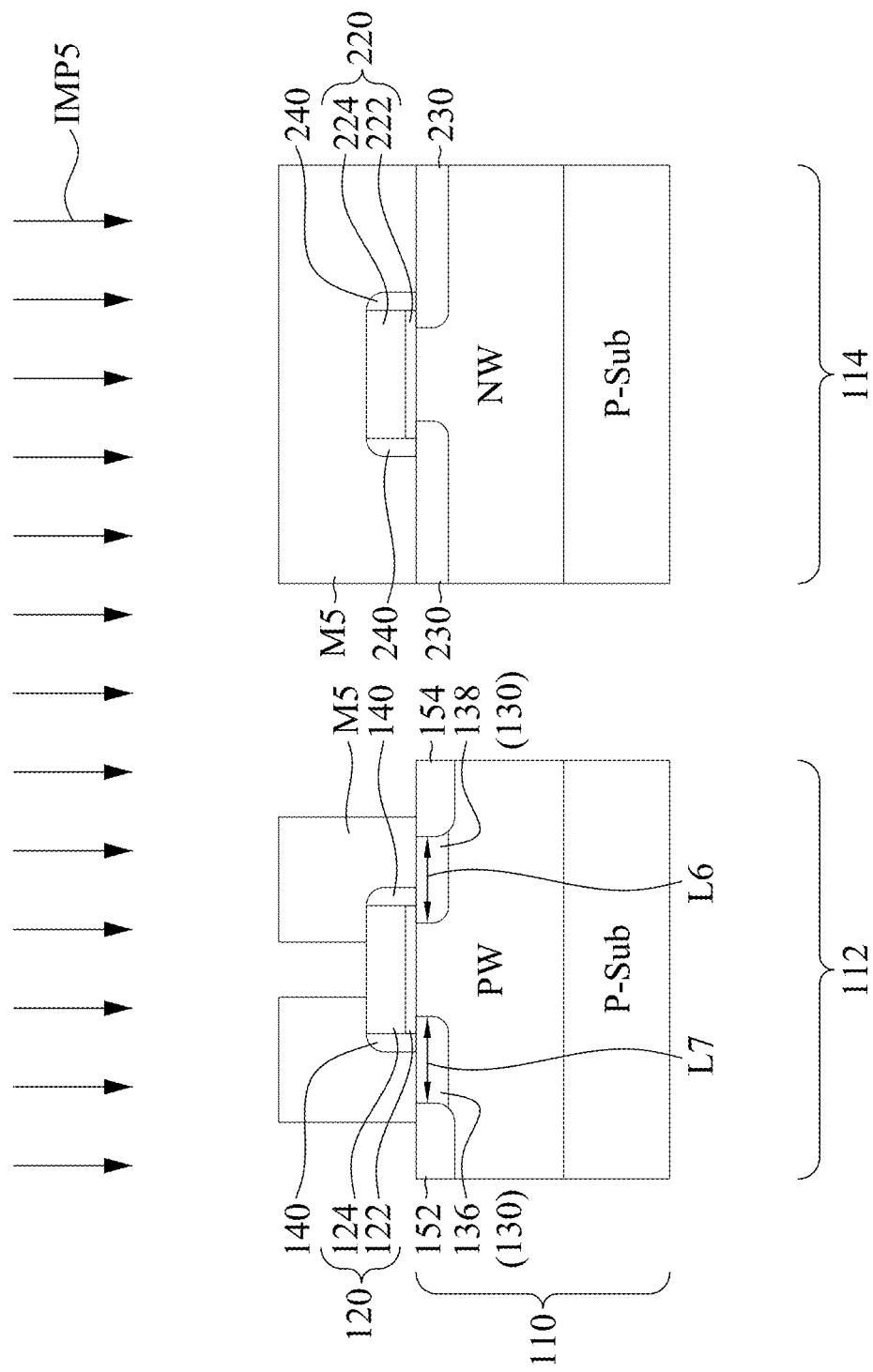
FIGS. 12-16 illustrate cross-sectional views of intermediate stages in the formation of an integrated circuit in accordance with some embodiments of the present disclosure.

FIG. 12 illustrates a step performed after forming gate spacers 140 and 240 as illustrated in FIG. 5. In FIG. 12, a patterned mask layer M5 (e.g., patterned photoresist) is formed on the PFET region 114 and partial regions of two opposite n-type LD regions 130 within the NFET region 112. For example, the patterned mask layer M5 covers opposite portions of the gate structure 120 (e.g., a left portion and a right portion of the gate structure 120 as depicted in FIG. 12), two opposite gate spacers 140 on opposite sides of the gate structure 120, and two opposite n-type LDD regions 130 next to the opposite gate spacers 140. The patterned mask layer M5 exposes other portions of the opposite n-type LDD regions 130. Once the patterned mask layer M5 is formed, an n-type heavy ion implantation IMP5 is performed to dope an n-type impurity (e.g., phosphorus, arsenic, antimony, or the like) into the exposed the n-type LDD regions 130, thus forming an n-type source region 152 and an n-type drain region 154 doped with the n-type impurity. Dopant concentration and depth about the n-type source/drain regions 152/154 are discussed previously with respect to FIG. 6, and thus they are not repeated herein for the sake of brevity.

The pattern of the patterned mask layer M5 is designed such that the n-type LDD regions 130 have first and second remaining portions 136 and 138 substantially symmetric about the vertical axis of the gate structure 120. The remaining n-type LDD portions 136 and 138 have a dopant concentration substantially unchanged by the n-type heavy ion implantation IMP5. Therefore, the remaining n-type LDD portions 136 and 138 keep a lower dopant concentration than the dopant concentration of the n-type source/drain regions 152/154. The first remaining n-type LDD portion 136 extends from the n-type source region 152 toward the channel region below the gate structure 120, and is thus referred to as an n-type source extension region 136. The second remaining n-type LDD portion 138 extends from the n-type drain region 154 toward the channel region below the gate structure 120, and is thus referred to as an n-type drain extension region 138. Because the patterned mask layer M5 covers both opposite n-type LDD regions 130, the n-type source extension region 136 and the n-type drain extension region 138 are substantially symmetric after performing the n-type heavy ion implantation IMP5 by using the patterned mask layer M5 as an implantation mask. In greater detail, a lateral length L6 of the n-type drain extension region 138 is comparable or substantially equal to a lateral length L7 of the n-type source extension region 136. Therefore, the n-type source/drain regions 152 and 154 have comparable or substantially the same lateral distance. Therefore, such a symmetric NFET is applicable for a circuit that has a relaxed transistor density requirement, or applicable for a circuit having comparable source voltage and drain voltage.

Other details about the n-type source extension region 136, n-type drain extension region 138, the n-type source region 152, and the n-type drain region 154 are discussed previously with respect to FIG. 6, and thus they are not repeated herein for the sake of brevity. After the n-type heavy ion implantation IMP5 is completed, the patterned mask layer M5 is removed, for example, using a plasma ash process. However, any other suitable process, such as a wet strip, may be utilized to remove the patterned mask layer M5 as well.

Figure 13:
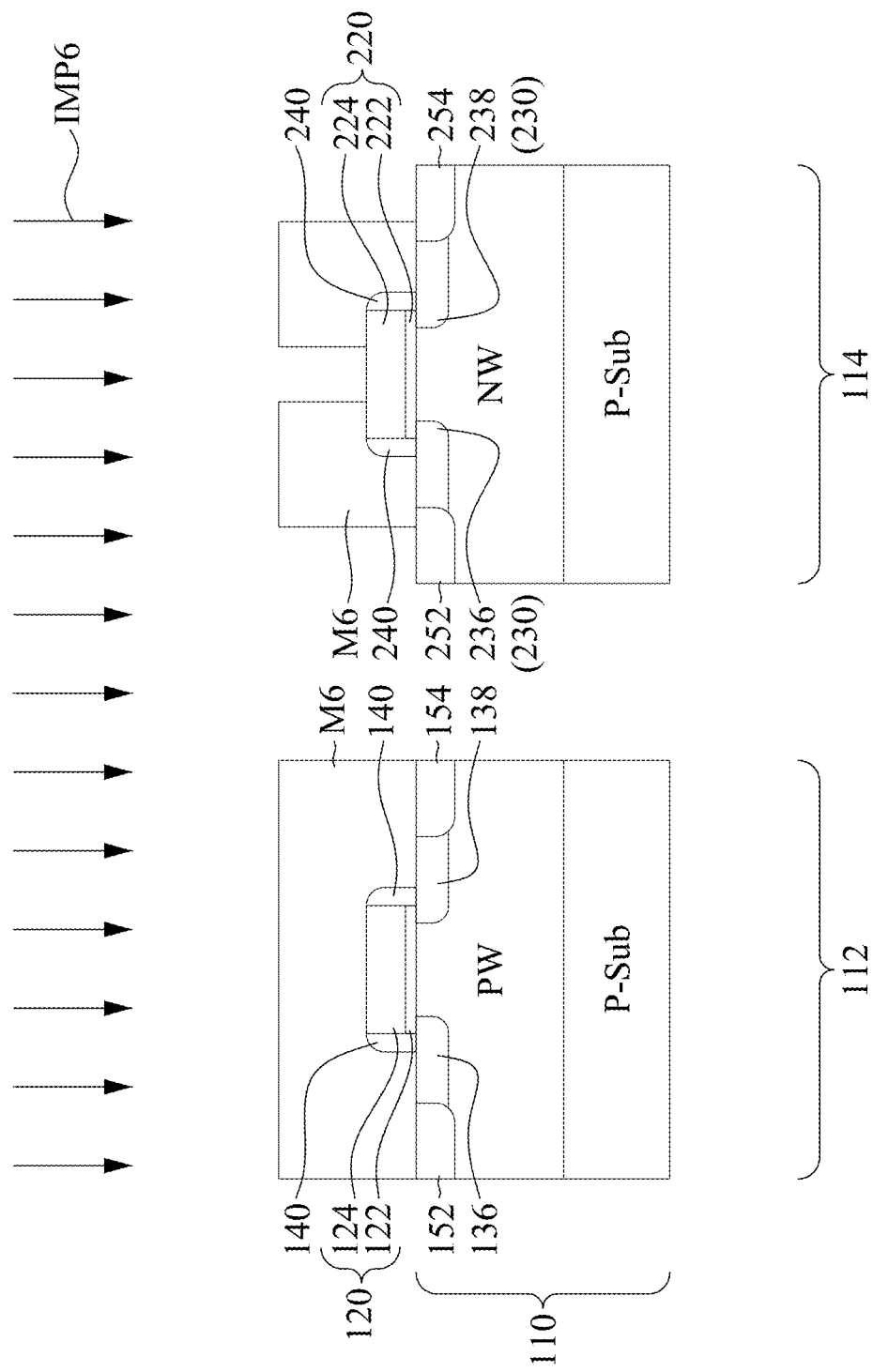

In FIG. 13, a patterned mask layer M6 (e.g., patterned photoresist) is formed on the NFET region 112 and partial regions of two opposite p-type LD regions 230 within the PFET region 114. For example, the patterned mask layer M6 covers opposite portions of the gate structure 220 (e.g., a left portion and a right portion of the gate structure 220 as depicted in FIG. 13), two opposite gate spacers 240 alongside the gate structure 220, and two opposite p-type LDD regions 230 next to the opposite gate spacers 240. The patterned mask layer M6 exposes other portions of the opposite p-type LDD regions 230. Once the patterned mask layer M6 is formed, a p-type heavy ion implantation IMP6 is performed to dope a p-type impurity (e.g., boron, boron fluoride, indium, or the like) into the exposed the p-type LDD regions 230, thus forming a p-type source region 252 and a p-type drain region 254. Dopant concentration and depth about the p-type source/drain regions 252/254 are discussed previously with respect to FIG. 7, and thus they are not repeated herein for the sake of brevity.

The pattern of the patterned mask layer M6 is designed such that the p-type LDD regions 230 have first and second remaining portions 236 and 238 substantially symmetric about the vertical axis of the gate structure 220. The remaining p-type LDD portions 236 and 238 have a dopant concentration substantially unchanged by the p-type heavy ion implantation IMP6. Therefore, the remaining p-type LDD portions 236 and 238 keep a lower dopant concentration than the dopant concentration of the p-type source/drain regions 252/254. The first remaining p-type LDD portion 236 extends from the p-type source region 252 toward the channel region below the gate structure 220, and is thus referred to as a p-type source extension region 236. The second remaining p-type LDD portion 238 extends from the p-type drain region 254 toward the channel region below the gate structure 220, and is thus referred to as a p-type drain extension region 238. Because the patterned mask layer M6 covers both opposite p-type LDD regions 230, the p-type source extension region 236 and the p-type drain extension region 238 are substantially symmetric after performing the p-type heavy ion implantation IMP6 by using the patterned mask layer M6 as an implantation mask. In greater detail, a lateral length of the p-type drain extension region 238 is comparable or substantially equal to a lateral length of the p-type source extension region 236. Therefore, the p-type source/drain regions 252 and 254 have comparable or substantially the same lateral distance. Therefore, such a symmetric PFET is applicable for a circuit that has a relaxed transistor density requirement, or applicable for a circuit having comparable source voltage and drain voltage.

Other details about the p-type source extension region 236, p-type drain extension region 238, the p-type source region 252, and the p-type drain region 254 are discussed previously with respect to FIG. 7, and thus they are not repeated herein for the sake of brevity. After the p-type heavy ion implantation IMP6 is completed, the patterned mask layer M6 is removed, for example, using a plasma ash process. However, any other suitable process, such as a wet strip, may be utilized to remove the patterned mask layer M6 as well.

Figure 14:
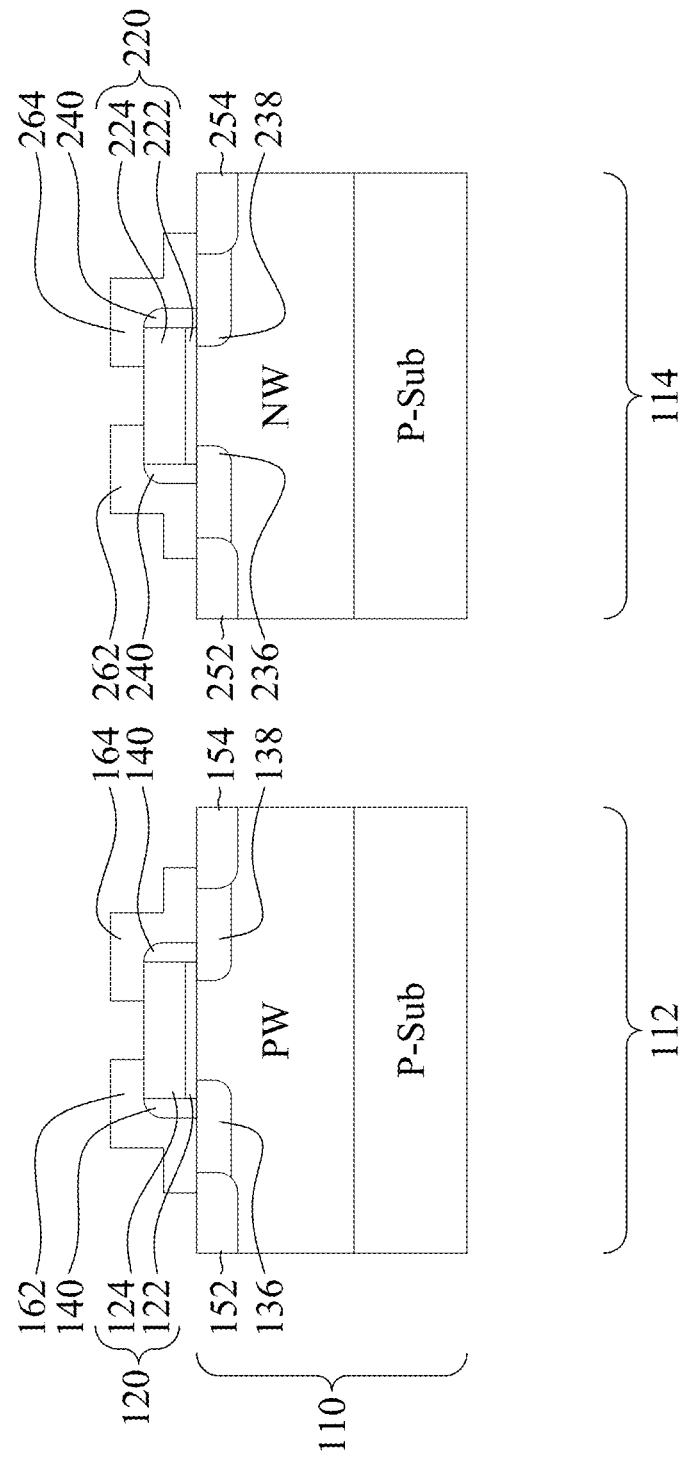

In FIG. 14, RPO layers 162 and 164 are formed within the NFET region 112 and cover the substantially symmetric n-type source/drain extension regions 136 and 138 respectively, and RPO layers 262 and 264 are formed within the PFET region 114 and cover the substantially symmetric p-type source/drain extension regions 236 and 238 respectively. In some embodiments, the RPO layers 162 and 164 are substantially symmetric about the vertical axis of the gate structure 120, and the RPO layers 262 and 264 are substantially symmetric about the vertical axis of the gate structure 220. Details about materials, fabrication methods, and dimensions of the RPO layers 162, 164, 262, and 264 are similar to that of the RPO layers 160 and 260, and thus they are not repeated herein for the sake of brevity.

Figure 15:
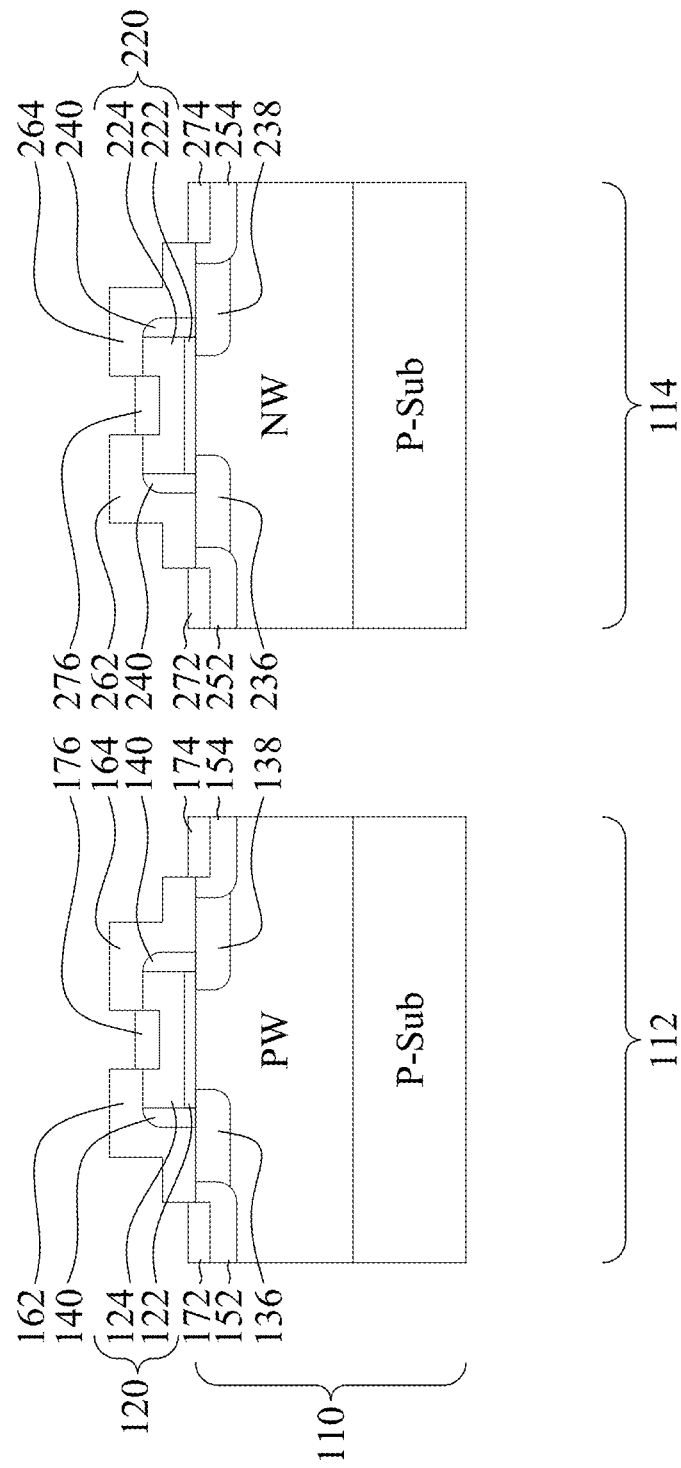

In FIG. 15, silicide regions 172, 174, 176, 272, 274, and 276 can be formed respectively on the n-type source region 152, the n-type drain region 174, the NFET gate electrode 124, the p-type source region 252, the p-type drain region 254, and the PFET gate electrode 224 by using a silicidation process (e.g., self-aligned silicidation process). Details about materials, fabrication methods, and dimensions of silicide regions are discussed previously with respect to FIG. 9, and thus they are not repeated herein for the sake of brevity.

Figure 16:
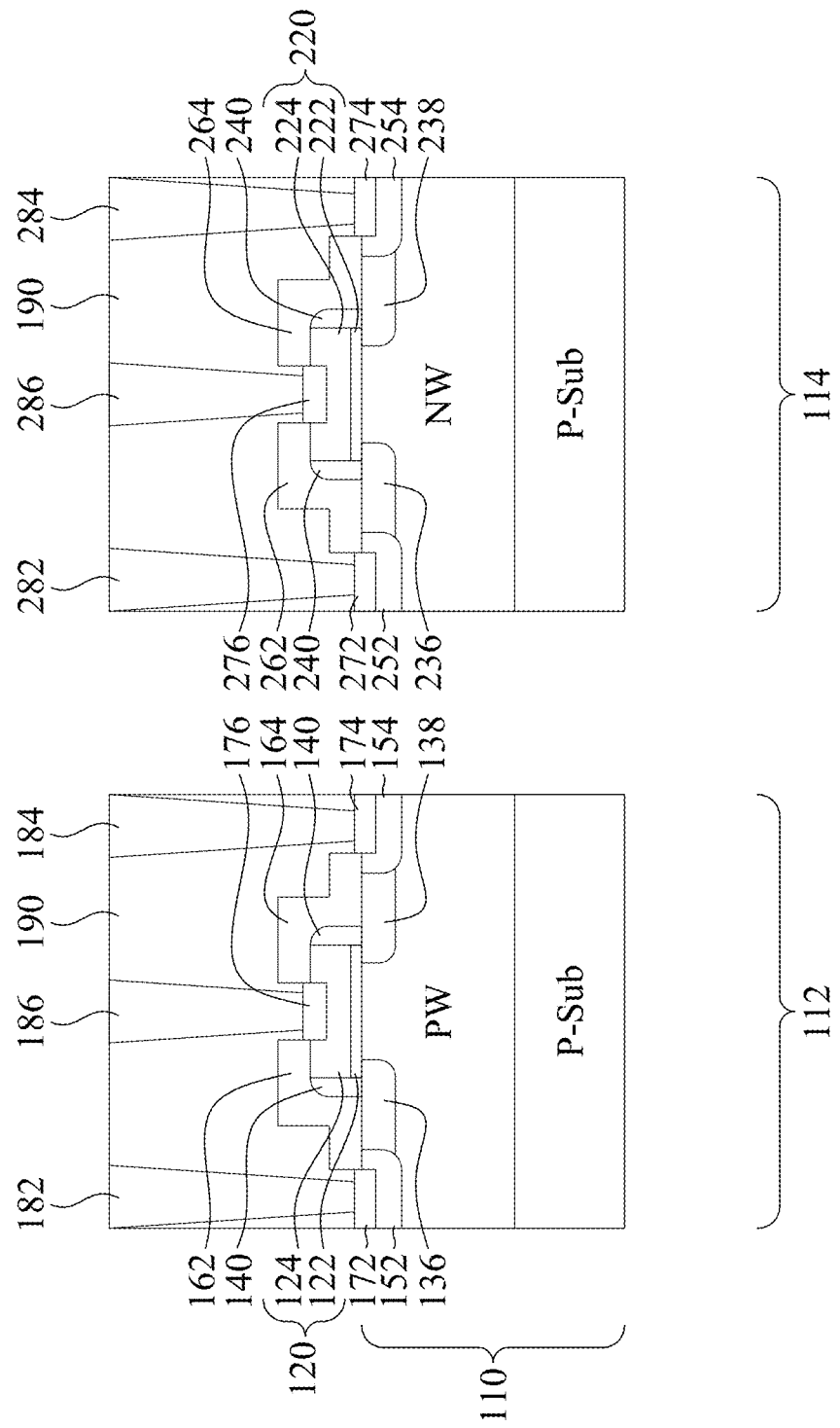

In FIG. 16, an ILD layer 190 is deposited over the NFET region 112 and the PFET region 114. Next, in the NFET region 112 a source contact 182 is formed extending through the ILD layer 190 to the n-type source silicide region 172, a drain contact 184 is formed extending through the ILD layer 190 to the n-type drain silicide region 174, and a gate contact 186 is formed extending through the ILD layer 190 to the gate silicide region 176; in the PFET region 114 a source contact 282 is formed extending through the ILD layer 190 to the p-type source silicide region 272, a drain contact 284 is formed extending through the ILD layer 190 to the p-type drain silicide region 274, and a gate contact 286 is formed extending through the ILD layer 190 to the gate silicide region 276. Details about materials and fabrication methods of the ILD layer 190 and contacts 182, 184, 186, 282, 284, and 286 are discussed previously with respect to FIG. 10, and thus they are not repeated herein for the sake of brevity.

FIGS. 17-21 show exemplary sequential processes for manufacturing an integrated circuit according to some embodiments of the present disclosure. It is understood that additional operations can be provided before, during, and after processes shown by FIGS. 17-21, and some of the operations described below can be replaced or eliminated, for additional embodiments of the method. The order of the operations/processes may be interchangeable.

Figure 17:
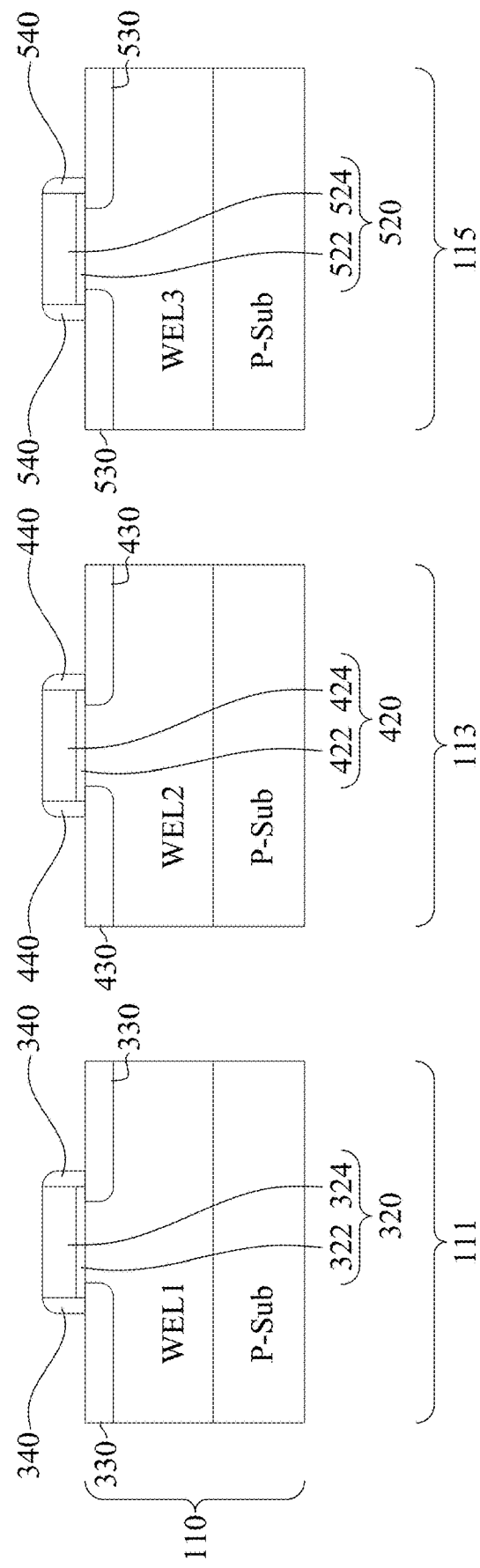
FIGS. 17-21 illustrate cross-sectional views of intermediate stages in the formation of an integrated circuit in accordance with some embodiments of the present disclosure.

FIG. 17 illustrates a step performed after gate spacer formation (as illustrated in FIG. 5). In FIG. 7, the substrate 110 includes first, second and third device regions 111, 113, and 115. In some embodiments, the first device region 111 is used to for a circuit with a stricter transistor density requirement, the second device region 113 is used for a circuit with relaxed transistor density requirement, and the third device region 115 is used for a circuit with a relaxed GIDL requirement.

In some embodiments, the first second, and third device regions 111, 113, and 115 respectively include well regions WEL1, WEL2, and WEL3, which may be p-type well and/or n-type well. Details about materials and fabrication methods of the p-type wells and n-type wells are discussed previously with respect to FIG. 1, and thus they are repeated for the sake of brevity.

In some embodiments, the first, second, and third device regions 111, 113, and 115 respectively include a gate structure 320 having a gate dielectric layer 222 and a gate electrode 324, a gate structure 420 having a gate dielectric layer 422 and a gate electrode 424, a gate structure 520 having a gate dielectric layer 522 and a gate electrode 524. Details about materials and fabrication methods of the gate structures 320, 420, and 520 are discussed previously with respect to FIG. 2, and thus they are not repeated for the sake of brevity.

In some embodiments, the first, second, and third device regions 111, 113, and 115 respectively include LDD regions 330 on opposite sides of the gate structure 320, LDD regions 430 on opposite sides of the gate structure 420, and LDD regions 530 on opposite sides of the gate structure 520. The LDD regions 330, 430, and 530 include n-type LDD regions and/or p-type LDD regions. Details about materials, fabrication methods, and dimensions of the n-type LDD regions and p-type LDD regions are discussed previously with respect to FIGS. 3 and 4, and thus they are not repeated for the sake of brevity.

In some embodiments, the first, second, and third device regions 111, 113, and 115 respectively include gate spacers 340 on opposite sidewalls of the gate structure 320, gate spacers 440 on opposite sidewalls of the gate structure 420. Details about materials and fabrication methods of the gate spacers 340, 440, and 550 are discussed previously with respect to FIG. 5, and thus they are not repeated for the sake of brevity.

Figure 18:
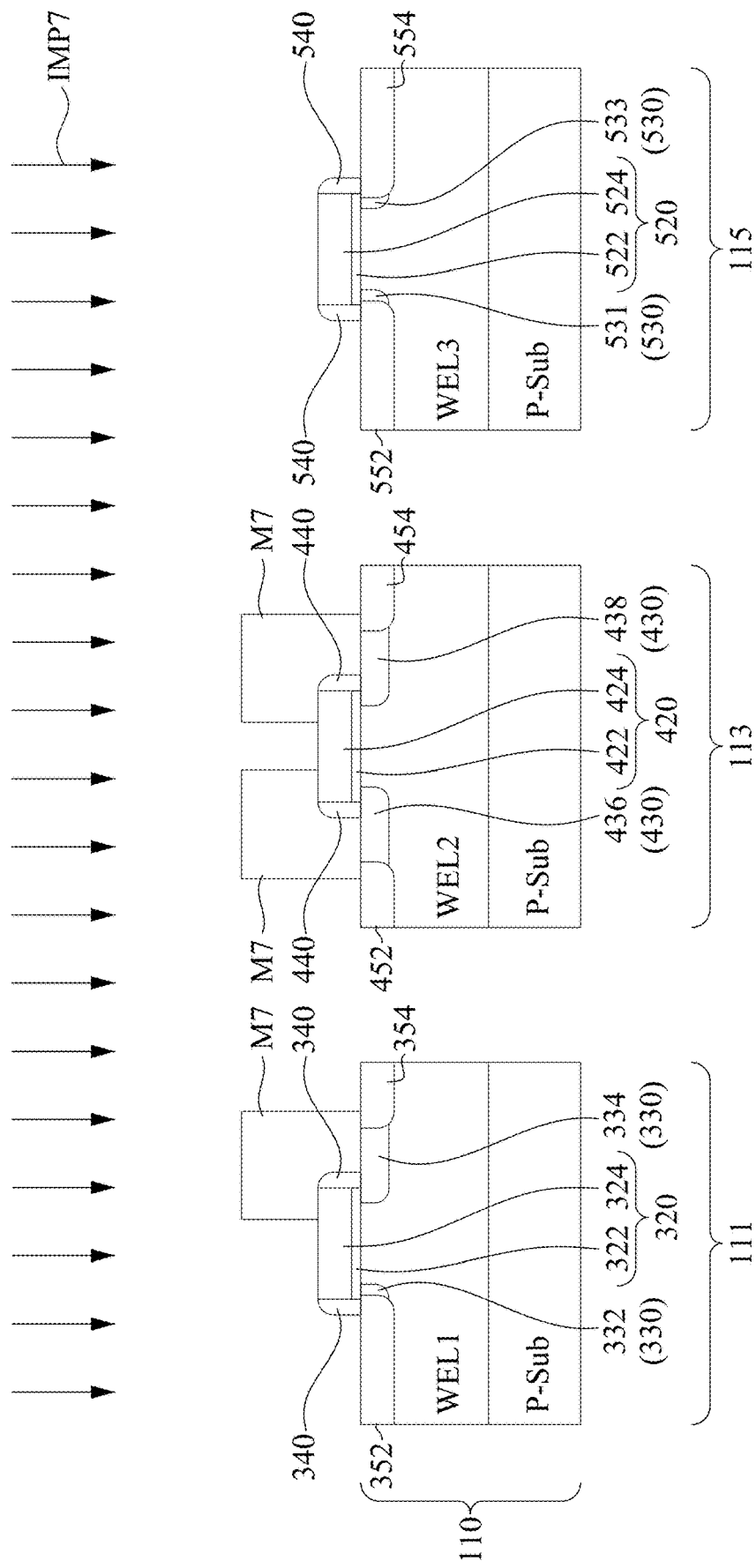

In FIG. 18, a patterned mask layer M7 is formed covering one of a pair of LDD regions 330 within the first device region 111, covering both of a pair of LDD regions 430 within the second device region 113, and exposing both of a pair of LDD regions 530 within the third device region 115. For example, in the device region 111 the patterned mask layer M7 covers a portion of the gate structure 320 (e.g., a right portion of the gate structure 320 as depicted in FIG. 18), a gate spacer 340 next to the portion of the gate structure 320, and an LDD region 330 next to the gate spacer 340, and exposes other portions of the LDD regions 330; in the second device region 113, the patterned mask layer M7 covers opposite portions of the gate structure 420 (e.g., a left portion and a right portion of the gate structure 420 as depicted in FIG. 18), two opposite gate spacers 440 on opposite sides of the gate structure 420, and two opposite LDD regions 430 next to the opposite gate spacers 440, and exposes other portions of the opposite LDD regions 430. Once the patterned mask layer M7 is formed, a heavy ion implantation IMP7 is performed to dope an n-type impurity (e.g., phosphorus, arsenic, antimony, or the like) or a p-type impurity (e.g., boron, boron fluoride, indium, or the like) into the exposed LDD regions 330, 430 and 530, resulting in a source region 352 and a drain region 354 in the first device region 111, a source region 452 and a drain region 454 in the second device region 113, and a source region 552 and a drain region 554 in the third device region 115. Dopant concentrations and depths about the source/drain regions 352, 354, 452, 454, 552, and 554 are discussed previously with respect to FIGS. 6 and 7, and thus they are not repeated herein for the sake of brevity.

The pattern of patterned mask layer M7 is designed such that remaining portions of the LDD regions 330 within the first device region 111 have a source extension region 332 and a drain extension region 334 asymmetric about a vertical axis of the gate structure 320, remaining portions of the LDD regions 430 within the second device region 113 have a source extension region 436 and a drain extension region 438 substantially symmetric about a vertical axis of the gate structure 420, and remaining portions of the LDD regions 530 within the third device region 115 have a source extension region 531 and a drain extension region 533 substantially symmetric about a vertical axis of the gate structure 520 but having smaller lateral lengths than the source/drain extension regions 436/438.

In the first device region 111, the drain extension region 334 has a greater lateral length than the source extension region 332, which in turn allows for suppressing GIDL without excessively increasing transistor size. Therefore, a circuit with a stricter transistor density requirement can be formed in the first device region 111. In the second device region 113, the drain extension region 438 increases a distance between the drain region 454 and the gate structure 420 to suppresses GIDL, and source extension region 436 also increases a distance between the source region 452 and the gate structure 420. Therefore, transistor size in the second device region 113 may be greater than transistor size in the first device region 111. As a result, a circuit having a stricter GIDL requirement but relaxed transistor density requirement can be formed in the second device region 113. In the third device region 115, the drain extension region 533 does not increase a distance between the drain region 554 and the gate structure 520, and thus the transistors in the third device region 115 may have higher GIDL than transistors in the first and second device regions 111 and 113. Therefore, a circuit having a relaxed GIDL requirement but a stricter transistor density requirement can be formed in the third device region 115.

After the heavy ion implantation IMP7 is completed, the patterned mask layer M7 is removed, for example, using a plasma ash process. However, any other suitable process, such as a wet strip, may be utilized to remove the patterned mask layer M7 as well. In some embodiments, after the heavy ion implantation IMP7 is completed, an anneal may be performed to repair implant damage and to activate the p-type and/or n-type impurities that were implanted.

Figure 19:
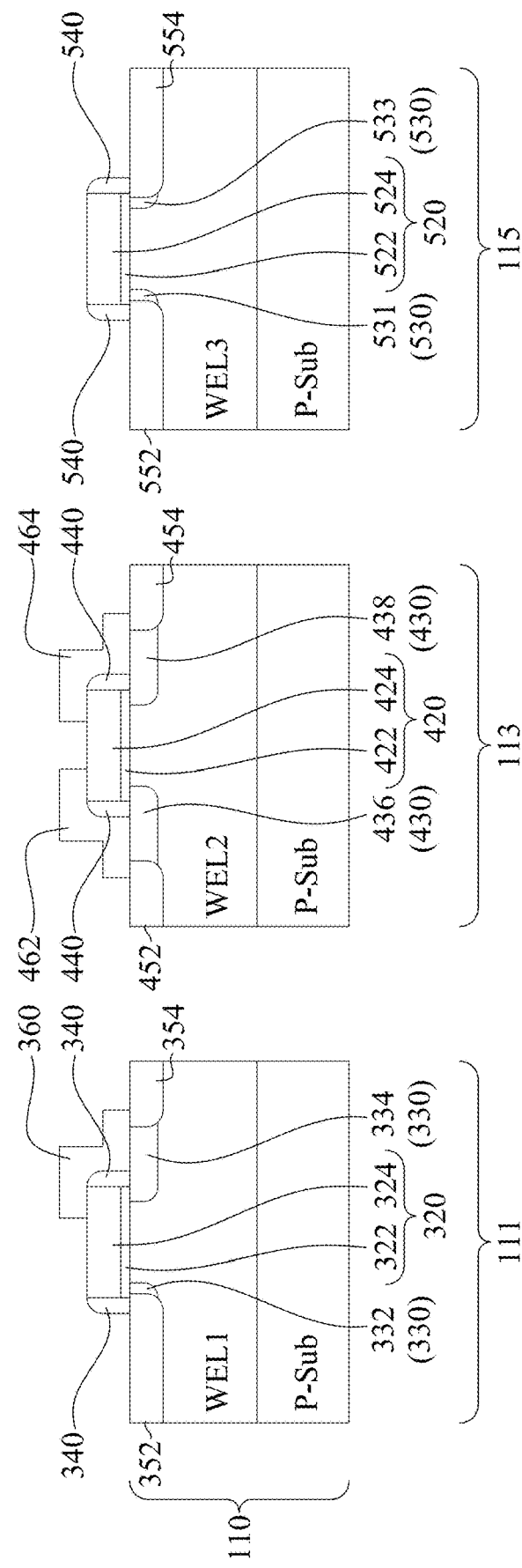

In FIG. 19, an RPO layer 360 is formed within the first device region 111 and covers the drain extension region 334, RPO layers 462 and 464 are formed within the second device region 113 and respectively cover the substantially symmetric source extension region 436 and drain extension region 438. No RPO layer is formed within the third device region 11. The RPO layers 462 and 464 are substantially symmetric about the vertical axis of the gate structure 420. Details about materials, fabri cation methods, and dimensions of the RPO layers 360, 462, and 464 are similar to that of the RPO layers 160 and 260, and thus they are not repeated herein for the sake of brevity.

Figure 20:
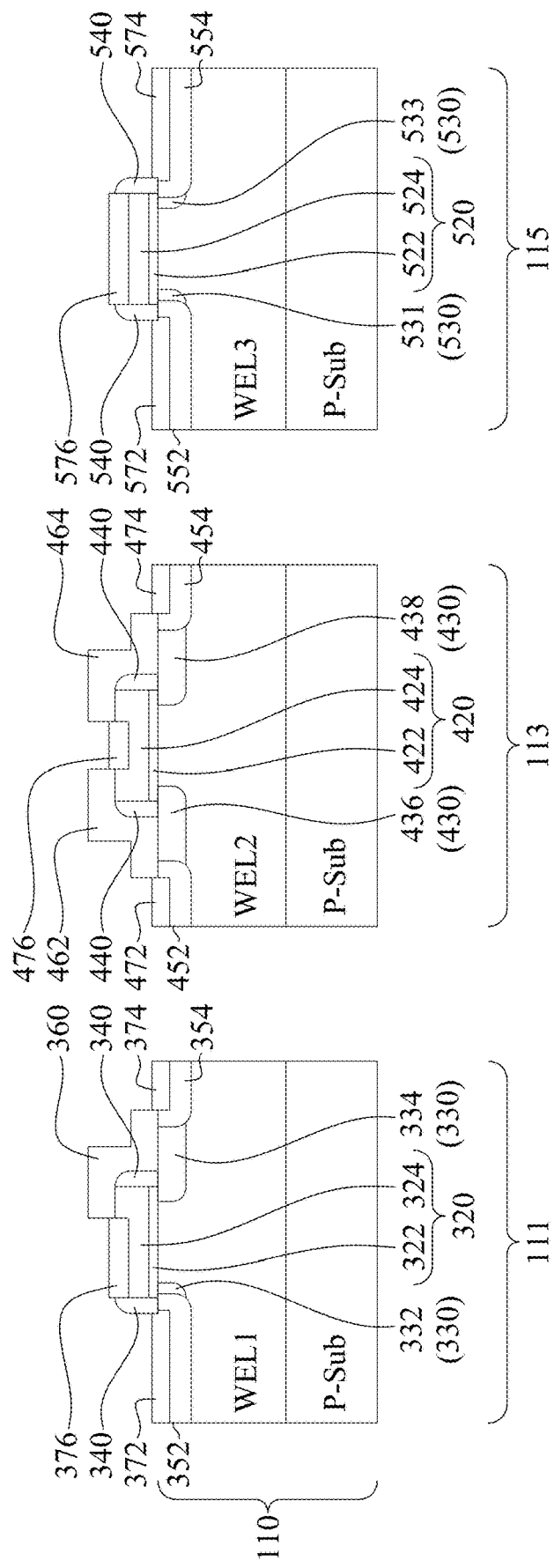

In FIG. 20, a silicidation process (e.g., self-aligned silicidation process) is performed to form silicide regions 372, 374, and 376 respectively on a source region 352, a drain region 354, and a gate structure 324 within the first device region 111, to form silicide regions 472, 474, and 476 respectively on a source region 452, a drain region 454, and a gate structure 424 within the second device region 113, and to form silicide regions 572, 574, and 576 respectively on a source region 552, a drain region 554, and a gate structure 524 within the third device region 115. Details about materials, fabrication methods, and dimensions of silicide regions are discussed previously with respect to FIG. 9, and thus they are not repeated herein for the sake of brevity.

Figure 21:
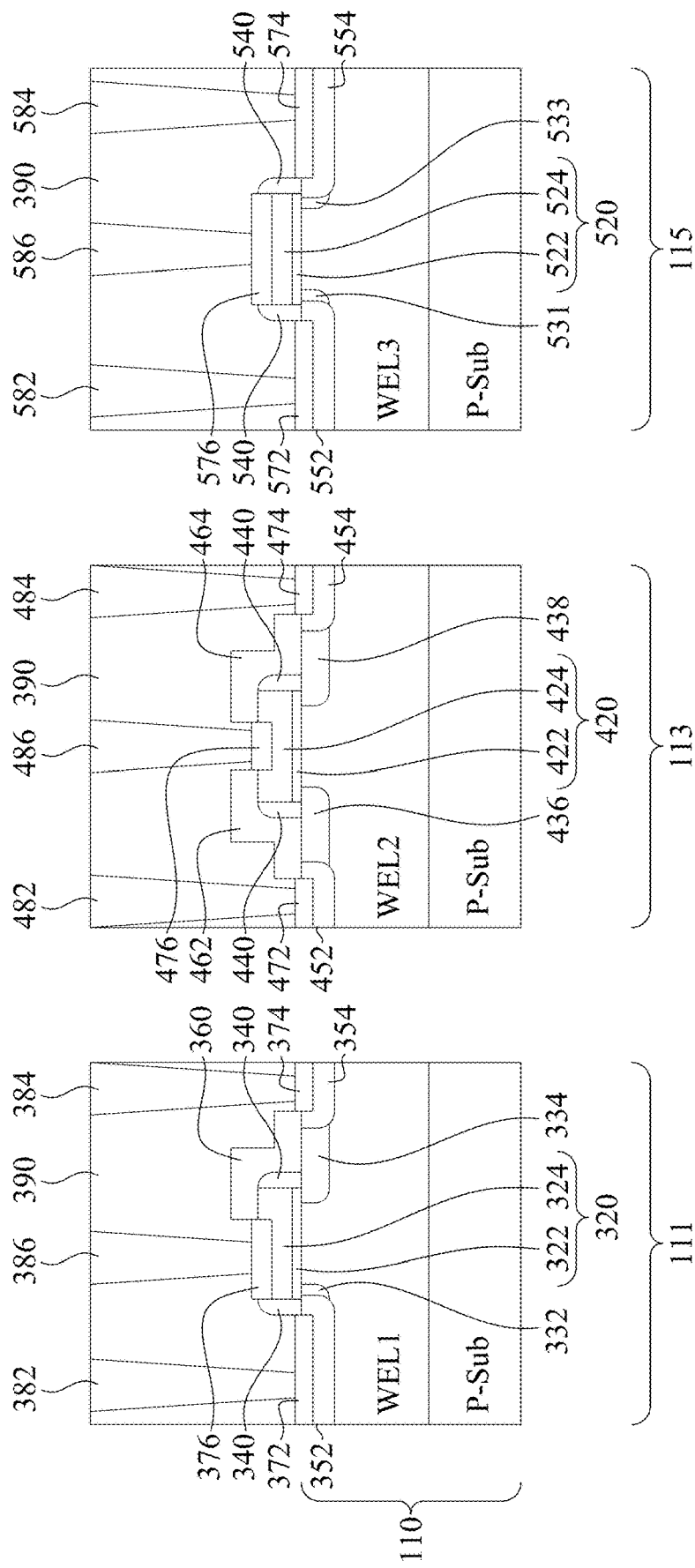

In FIG. 21, an ILD layer 390 is deposited over the first, second, and third device regions 111, 113, and 115. Next, in the first device region 111 a source contact 382 is formed extending through the ILD layer 390 to the source silicide region 372, a drain contact 384 is formed extending through the ILD layer 390 to the drain silicide region 374, and a gate contact 386 is formed extending through the ILD layer 390 to the gate silicide region 376; in the second device region 113 a source contact 482 is formed extending through the ILD layer 390 to the source silicide region 472, a drain contact 484 is formed extending through the ILD layer 390 to the drain silicide region 474, and a gate contact 486 is formed extending through the ILD layer 390 to the gate silicide region 476; and in the third device region 115 a source contact 582 is formed extending through the ILD layer 390 to the source silicide region 572, a drain contact 584 is formed extending through the ILD layer 390 to the drain silicide region 574, and a gate contact 586 is formed extending through the ILD layer 390 to the gate silicide region 576. Details about materials and fabrication methods of the ILD layer 390 and contacts 382, 384, 386, 482, 484, 486, 582, 584, and 586 are discussed previously with respect to FIG. 10, and thus they are not repeated herein for the sake of brevity.

Figure 22:
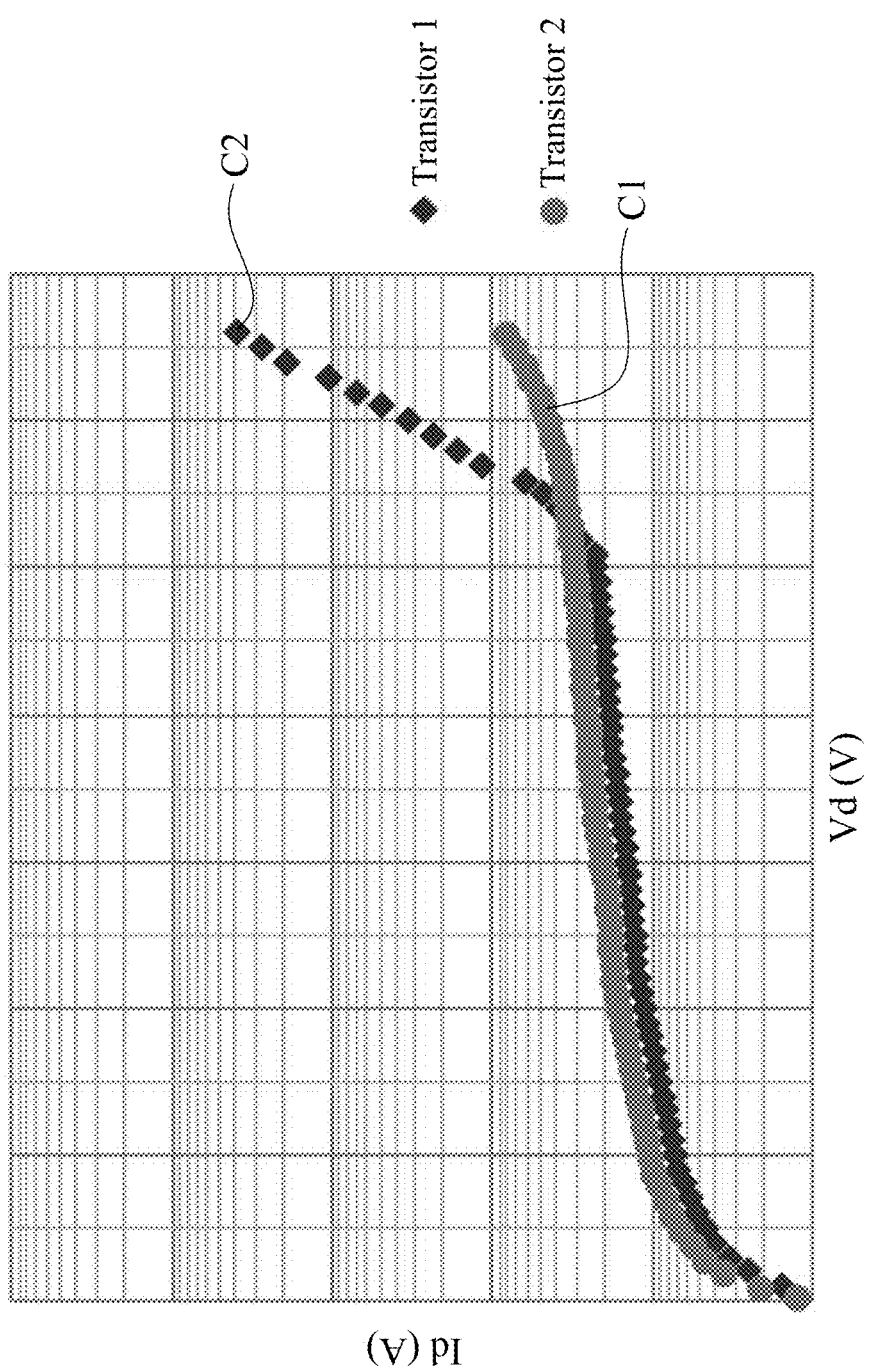
FIG. 22 is a graph illustrating example experiment results of off-currents in different transistors.

FIG. 22 illustrates example experiment results showing off-currents (also called leakage current) in different transistors 1 and 2, wherein the drain current is shown on the vertical axis in FIG. 22, and the drain voltage Vd is shown on the horizontal axis in FIG. 22. Curve C1 is a leakage current curve of the transistor 1, and Curve C2 is a leakage current curve of the transistor 2. The transistor 1 has a drain extension region extending beyond the gate spacer (e.g., transistor in device region 111 or 113 as illustrated in FIG. 21). The transistor 2 has a drain extension region that does not extend beyond the gate spacer (e.g., transistor in device region 115 as illustrated in FIG. 21). As illustrated in FIG. 22, the leakage current curve C2 becomes steeper than the leakage current curve C1 when the drain voltage exceeds a certain value. In other words, the transistor 2 is more susceptible to GIDL than the transistor 1. These experimental results show that the transistor 1 with elongated drain extension region exhibits an improved suppression on GIDL as compared to the transistor 2.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the GIDL can be suppressed by using the elongated drain extension region that extends beyond the gate spacer. Another advantage is that the elongated drain extension region can be formed in an LDD formation process, and thus the process stability is comparable to a standard CMOS fabrication process without additional cost.

In some embodiments, a method includes forming a gate structure over a substrate; forming a first gate spacer and a second gate spacer on opposite sidewalls of the gate structure, respectively; implanting a first dopant of a first conductivity type into the substrate form a lightly doped source region adjacent to the first gate spacer, and a lightly doped drain region adjacent to the second gate spacer; forming a patterned mask over a first portion of the lightly doped drain region, while leaving a second portion of the lightly doped drain region exposed; and with the patterned mask in place, implanting a second dopant of the first conductivity type into the substrate, resulting in converting the second portion of the lightly doped drain region into a drain region. In some embodiments, forming the patterned mask is performed such that the lightly doped source region is free from coverage by the patterned mask. In some embodiments, a doping concentration the first portion of the lightly doped drain region remains unchanged during implanting the second dopant into the substrate. In some embodiments, implanting the second dopant into the substrate also results in converting a portion of the lightly doped source region into a source region, while leaving another portion of the lightly doped source region under the first gate spacer unconverted. In some embodiments, the unconverted portion of the lightly doped source region has a lateral length less than a lateral length of the first portion of the lightly doped drain region. In some embodiments, the source region and the drain region are asymmetrical about a vertical axis of the gate structure. In some embodiments, the patterned mask is formed also over a first portion of the lightly doped source region, while leaving a second portion of the lightly doped source region exposed. In some embodiments, implanting the second dopant into the substrate also results in converting the second portion of the lightly doped source region into a source region. In some embodiments, the first portion of the lightly doped source region has a lateral length substantially the same as a lateral length of the first portion of the lightly doped drain region. In some embodiments, the method further comprises after implanting the second dopant into the substrate, removing the patterned mask to expose the first portion of the lightly doped drain region and the first portion of the lightly doped source region, and after removing the patterned mask, forming a first protection layer over the first portion of the lightly doped drain region and a second protection layer over the first portion of the lightly doped drain region.

In some embodiments, forming a gate structure over a substrate; forming a first gate spacer on a first side of the gate structure, and a second gate spacer on a second side of the gate structure; forming a lightly doped source region in a vicinity of the first gate spacer, and a lightly doped drain region in a vicinity of the second gate spacer; forming a source region laterally extending from the lightly doped source region in a direction away from the gate structure, and a drain region laterally extending from the lightly doped drain region in a direction away from the gate structure; after forming the source region and the drain region, forming a protection layer extending past a boundary between the lightly doped drain region and the drain region and terminating prior to covering an entirety of the drain region; and with the protection layer in place, forming a drain silicide region in the drain region. In some embodiments, the protection layer further extends past an interface between the second gate spacer and the gate structure and terminating prior to covering an entirety of the gate structure. In some embodiments, with the protection layer in place, forming a gate silicide region on the gate structure. In some embodiments, the gate silicide region is in contact with the first gate spacer but separated from the second gate spacer. In some embodiments, the source region is free of the protection layer. In some embodiments, the method further comprises forming a source silicide region in the source region, the source silicide region has a length greater than the drain silicide region.

In some embodiments, a device includes a gate structure over a substrate, a first gate spacer and a second gate spacer on opposite sides of the gate structure, respectively, a lightly doped drain region laterally extending from directly below the first gate spacer to past an outermost sidewall of the first gate spacer, a drain region laterally extending from the lightly doped drain region in a direction away from the gate structure, a first protection layer over the lightly doped drain region, and a drain silicide region over the drain region and contacting an end surface of the first protection layer. In some embodiments, the first protection layer has a stepped bottom surface structure comprising a first step extending from the lightly doped drain region to past a boundary between the lightly doped drain region and the drain region, a second step extending from a top surface of the gate structure to past an interface between the gate structure and the first gate spacer, and a step rise connecting the first step and the second step. In some embodiments, the device further comprises a lightly doped source region laterally extending from directly below the second gate spacer to past an outermost sidewall of the second gate spacer, a source region laterally extending from the lightly doped source region in a direction away from the gate structure, a second protection layer over the lightly doped source region, and a source silicide region over the source region and contacting an end surface of the second protection layer. In some embodiments, the device further comprises a gate silicide region over the gate structure, the gate silicide region extending from the first protection layer to the second protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate structure over a substrate, the gate structure comprising a gate dielectric layer and a gate electrode over the gate dielectric layer;
    forming a first gate spacer and a second gate spacer on opposite sidewalls of the gate structure, respectively;
    implanting a first dopant of a first conductivity type into the substrate to form a lightly doped source region adjacent to the first gate spacer, and a lightly doped drain region adjacent to the second gate spacer;
    forming a patterned mask, in a first process step, over a first portion of the lightly doped drain region, while leaving a second portion of the lightly doped drain region exposed, wherein the patterned mask and the gate dielectric layer are both in contact with the lightly doped drain region, and an entirety of the patterned mask is formed of a different material than the gate dielectric layer;
    with the patterned mask in place, implanting a second dopant of the first conductivity type into the substrate, resulting in converting the second portion of the lightly doped drain region into a drain region, and converting a portion of the lightly doped source region into a source region, wherein a remainder of the lightly doped source region non-overlaps with the first gate spacer, and a boundary between the source region and the remainder of the lightly doped source region is laterally offset from an inner sidewall of the first gate spacer to a position directly below the gate structure, but a remainder of the lightly doped drain region overlaps with an entirety of the second gate spacer;

removing the patterned mask from the first portion of the lightly doped drain region;

after removing the patterned mask, forming a patterned silicide blocking layer, in a second process step separated from the first process step, over the first portion of the lightly doped drain region; and after removing the patterned mask and forming the patterned silicide blocking layer, performing a silicidation process to form a silicide region on the drain region.

2. The method of claim 1, wherein a doping concentration of the first portion of the lightly doped drain region remains substantially unchanged during implanting the second dopant into the substrate.

3. The method of claim 1, wherein the remainder of the lightly doped source region has a lateral length less than a lateral length of the first portion of the lightly doped drain region.

4. The method of claim 1, wherein the gate structure comprises a gate dielectric layer and a gate electrode over the gate dielectric layer, wherein the patterned mask is separated from the gate dielectric layer.

5. The method of claim 1, wherein a ratio of a lateral length of the remainder of the lightly doped drain region to a lateral length of the remainder of the lightly doped source region is in a range from about 2:1 to about 5:1.

6. A method, comprising:
forming a gate structure over a substrate, the gate structure comprising a gate dielectric layer and a gate electrode over the gate dielectric layer;

forming a first gate spacer on a first side of the gate structure, and a second gate spacer on a second side of the gate structure;

forming a lightly doped source region in a vicinity of the first gate spacer, and a lightly doped drain region in a vicinity of the second gate spacer;

forming a patterned mask, in a first process step, over a portion of the lightly doped drain region, wherein the patterned mask is spaced apart from the gate dielectric layer, wherein the patterned mask and the gate dielectric layer are both in contact with the lightly doped drain region, and an entirety of the patterned mask is formed of a different material than the gate dielectric layer;

with the patterned mask as an implantation mask, performing an implantation step to form a source region laterally extending from the lightly doped source region in a direction away from the gate structure, and a drain region laterally extending from the lightly doped drain region in a direction away from the gate structure, wherein after the implantation step, a remainder of the lightly doped source region non-overlaps with the first gate spacer, and a boundary between the source region and the remainder of the lightly doped source region is laterally offset from an inner sidewall of the first gate spacer to a position directly below the gate structure;

after forming the source region and the drain region, forming a protection layer in a second process step subsequent to the implantation step, the second process step comprising depositing a dielectric layer and then etching the dielectric layer to form the protection layer, the protection layer extending past a boundary between the lightly doped drain region and the drain region and terminating prior to covering an entirety of the drain region; and with the protection layer in place, forming a drain silicide region in the drain region.

7. The method of claim 6, wherein the protection layer further extends past an interface between the second gate spacer and the gate structure and terminating prior to covering an entirety of the gate structure.

8. The method of claim 6, further comprising:
with the protection layer in place, forming a gate silicide region on the gate structure.

9. The method of claim 6, wherein the source region is free of the protection layer.

10. The method of claim 6, further comprising:
forming a source silicide region in the source region, the source silicide region has a length greater than the drain silicide region.

11. The method of claim 6, wherein after performing the implantation step, a remainder of the lightly doped drain region overlaps with an entirety of the second gate spacer.

12. The method of claim 6, wherein after performing the implantation step to form the source region and the drain region, a length of the lightly doped drain region, when viewed in a cross section, is less than five times a length of the lightly doped source region.

13. The method of claim 6, wherein the entirety of the patterned mask is formed of a photoresist different from a material of the gate dielectric layer.

14. A method, comprising:
forming a gate structure over a substrate, the gate structure comprising a gate dielectric layer and a gate electrode;

performing a first implantation process to form a lightly doped source region in a vicinity of a first side of the gate structure, and a lightly doped drain region in a vicinity of a second side of the gate structure;

forming a first gate spacer on the first side of the gate structure, and a second gate spacer on the second side of the gate structure;

forming an implantation mask over the substrate, wherein the implantation mask and the gate dielectric layer are both in contact with the lightly doped drain region, and an entirety of the implantation mask is formed of a different material than the gate dielectric layer;

performing a second implantation process, using the implantation mask as a mask, to form a source region in the lightly doped source region and a drain region in the lightly doped drain region, wherein a lateral distance from the drain region to the gate structure is larger than a lateral distance from the source region to the gate structure, wherein after the second implantation process, a remainder of the lightly doped source region non-overlaps with the first gate spacer, and a boundary between the source region and the remainder of the lightly doped source region is laterally offset from an inner sidewall of the first gate spacer to a position directly below the gate structure;

removing the implantation mask; and after performing the second implantation process and removing the implantation mask, depositing an oxide layer on the lightly doped drain region and removing a portion of the oxide layer from the lightly doped source region.

15. The method of claim 14, wherein the oxide layer is further on a top surface of the gate structure.

16. The method of claim 14, further comprising:
forming a source silicide region on the source region; and
forming a drain silicide region on the drain region, wherein a lateral distance from the drain silicide region to the gate structure is larger than a lateral distance from the source silicide region to the gate structure.

17. The method of claim 14, further comprising:
forming a gate silicide region on a partial region of the gate structure.

18. The method of claim 14, wherein the first implantation process is performed before forming the first and second gate spacers.

19. The method of claim 14, wherein the first gate spacer overlaps the source region, but the second gate spacer non-overlaps the drain region.

20. The method of claim 14, wherein after performing the second implantation process, a remainder of the lightly doped drain region overlaps with an entirety of the second gate spacer.

* * * * *